(12) United States Patent
DiJaili et al.

(10) Patent No.: US 7,126,731 B1
(45) Date of Patent: Oct. 24, 2006

(54) OPTICAL LATCH BASED ON LASING SEMICONDUCTOR OPTICAL AMPLIFIERS

(75) Inventors: Sol P DiJaili, Moraga, CA (US); Jeffrey D Walker, El Cerrito, CA (US); John M Wachsman, Dublin, CA (US)

(73) Assignee: Finisar Corporation, Sunnyvale, CA (US)

( * ) Notice: Subject to any disclaimer, the term of this patent is extended or adjusted under 35 U.S.C. 154(b) by 200 days.

(21) Appl. No.: 10/789,126

(22) Filed: Feb. 27, 2004

Related U.S. Application Data

(62) Division of application No. 10/020,558, filed on Dec. 14, 2001, now Pat. No. 6,853,658.

(60) Provisional application No. 60/255,753, filed on Dec. 14, 2000, provisional application No. 60/274,437, filed on Mar. 9, 2001, provisional application No. 60/274,474, filed on Mar. 9, 2001.

(51) Int. Cl.
*G06E 1/00* (2006.01)
*G02F 3/00* (2006.01)

(52) U.S. Cl. ...................... 359/108; 359/107

(58) Field of Classification Search ............... 359/107, 359/108
See application file for complete search history.

(56) References Cited

U.S. PATENT DOCUMENTS

| | | |
|---|---|---|
| 3,467,906 A | 9/1969 | Cornely et al. |
| 3,828,231 A | 8/1974 | Yamamoto |
| 4,794,346 A | 12/1988 | Miller |
| 5,299,054 A | 3/1994 | Geiger |
| 5,305,412 A | 4/1994 | Paoli |
| 5,436,759 A | 7/1995 | Dijaili et al. |
| 5,604,628 A | 2/1997 | Parker et al. |
| 5,654,822 A | 8/1997 | Ducellier et al. |
| 5,673,141 A | 9/1997 | Gambini |
| 5,748,653 A | 5/1998 | Parker et al. |
| 5,754,571 A | 5/1998 | Endoh et al. |
| 5,771,320 A | 6/1998 | Stone |
| 5,778,132 A | 7/1998 | Csipkes et al. |
| 5,805,322 A | 9/1998 | Tomofuji |
| 5,949,807 A | 9/1999 | Fujimoto et al. |

(Continued)

FOREIGN PATENT DOCUMENTS

JP 56-6492 1/1981

(Continued)

OTHER PUBLICATIONS

Alcatel, *Alcatel Optronics Introduces a Gain-Clamped Semiconductor Optical Amplifier*, Press Release for Immediate Publication, OFC 1998, San Jose, 1 unnumbered page, Feb. 1998.

(Continued)

*Primary Examiner*—Fayez G. Assaf
(74) *Attorney, Agent, or Firm*—Workman Nydegger

(57) ABSTRACT

An optical latch based on a lasing semiconductor optical amplifier is disclosed. The optical latch is configured to achieve one or more stable states in response to the input of predetermined signals at a "SET" input and a "RESET" input of the optical latch. The optical latch includes first and second LSOAs, each of which is configured to receive a pump input and generate an amplifier output. Each LSOA is also associated with a respective combiner and splitter. The combiner associated with each LSOA combines an input signal from the "SET" or "RESET" input, as applicable, with a signal received from the splitter of the other LSOA and the resulting combined signal is then input to the LSOA. Each splitter receives a ballast laser output from the associated LSOA, which is then split into two signals, namely, an input to the combiner of the other LSOA and an output signal.

32 Claims, 21 Drawing Sheets

U.S. PATENT DOCUMENTS

| | | | |
|---|---|---|---|
| 5,960,024 | A | 9/1999 | Li et al. |
| 5,999,284 | A * | 12/1999 | Roberts .................... 359/108 |
| 5,999,293 | A | 12/1999 | Manning |
| 6,044,100 | A | 3/2000 | Hobson et al. |
| 6,061,156 | A | 5/2000 | Takeshita et al. |
| 6,115,517 | A | 9/2000 | Shiragaki et al. |
| 6,128,115 | A | 10/2000 | Shiragaki et al. |
| 6,215,583 | B1 | 4/2001 | Lagerstrom et al. |
| 6,243,407 | B1 | 6/2001 | Mooradian |
| 6,317,531 | B1 | 11/2001 | Chen et al. |
| 6,333,799 | B1 | 12/2001 | Bala et al. |
| 6,335,992 | B1 | 1/2002 | Bala et al. |
| 6,347,104 | B1 | 2/2002 | Dijaili et al. |
| 6,445,495 | B1 | 9/2002 | Walker et al. |
| 6,462,865 | B1 | 10/2002 | Chu et al. |
| 6,512,629 | B1 | 1/2003 | Dijaili et al. |
| 6,522,462 | B1 | 2/2003 | Chu et al. |
| 6,577,654 | B1 | 6/2003 | Dijaili et al. |
| 6,647,041 | B1 | 11/2003 | Verma et al. |
| 6,647,163 | B1 * | 11/2003 | Song ........................ 385/15 |
| 6,707,600 | B1 | 3/2004 | Dijaili et al. |
| 6,714,344 | B1 | 3/2004 | Islam et al. |
| 6,963,677 | B1 * | 11/2005 | Spickermann et al. ........ 385/16 |
| 2002/0001112 | A1 | 1/2002 | Song |
| 2004/0012845 | A1 | 1/2004 | Wang |
| 2004/0017604 | A1 | 1/2004 | DiJaili et al. |

FOREIGN PATENT DOCUMENTS

| | | |
|---|---|---|
| JP | 1-129483 | 5/1989 |
| JP | 10-190147 | 7/1998 |
| JP | 02000012978 A | 1/2000 |

OTHER PUBLICATIONS

S. Diez et al., *All-Optical Switch for TDM and WDM/TDM Systems Demonstrated in a 640 Gbit/s Demultiplexing Experiment*, Electronics Letters, vol. 34, No. 8, pp. 803-805, Apr. 16, 1988.
S. Diez et al., *Gain-Transparent SOA-Switch for High-Bitrate OTDM Add/Drop Multiplexing*, IEEE Photonic Technology Letters, vol. 11, No. 1, pp. 60-62, Jan. 1999.
S. Diez et al., *Novel Gain-Transparent SOA-Switch for High Bitrate ODTM Add/Drop Multiplexing*, ECOC 1998, vol. 1, pp. 461-462, Sep. 1998.
F. Dorgeuille et al., *1.28 Tbit/s Throughput 8×8 Optical Switch Based on Arrays of Gain-Clamped Semiconductor Optical Amplifier Gates*, Optical Fiber Communication Conference, vol. 4, pp. 221-223, Mar. 2000.
F. Dorgeuille et al., *Fast Optical Amplifier Gate Array for WDM Routing and Switching Applications*, OFC 1998 Technical Digest, pp. 42-44, 1998.
P. Doussiere et al., *Clamped Gain Traveling Wave Semiconductor Optical Amplifier for Wavelength Division Multiplexing Application*, IEEE, US, vol. Conf. 14, pp. 185-186, New York, Sep. 14, 1994.
J.D. Evankow, Jr., et al., *Photonic Switching Modules Designed with Laser Diode Amplifiers*, IEEE, Journal on Selected Areas in Communications, vol. 6, No. 7, pp. 1087-1095, Aug. 1988.
B. Femier et al., *Fast (3000 ps) Polarization Insensitive Semiconductor Optical Amplifier Switch with Low Driving Current (70 mA)*, Semiconductor Laser Conference, Conference Digest, 14th IEEE International, pp. 130-131, Sep. 21-15, 1992.
J.E. Fouquet et al., *Compact, Scalable Fiber Optic Cross-Connect Switches*, IEEE, 1999 Digest of the LEOS Summer Topical Meetings, pp. 59-60, 1999.
M.M. Ibrahim, *Photonic Switch Using Surface-Emitting Laser Diode and AOD*, 16th National Radio Science Conference, NRSC 1999, pp. 1-8, Ain Shams University, Cairo, Egypt, Feb. 23-25, 1999.
G. Jeong et al., *Gain Optimization in Switches Based on Semiconductor Optical Amplifiers*, Journal of Lightwave Technology, vol. 13, No. 4, pp. 598-605, Apr. 1995.

S. Kitamura et al., *Spot-Size converter Integrated Semiconductor Optical Amplifiers for Optical Gate Applications*, IEEE Journal of Quantum Electronics, vol. 35, No. 7, pp. 1067-1074, Jul. 1999.
J. Leuthold et al., *All-Optical Space Switches with Gain and Principally Ideal Extinction Ratios*, IEEE Journal of Quantum Electronics, vol. 34, No. 4, pp. 622-633, Apr. 1998.
L.R. McAdams et al., *Linearizing High Performance Semiconductor Optical Amplifiers: Techniques and Performance*, LEOS Presentation, pp. 363-364, 1996.
J. Mork et al., *Semiconductor Devices for All-Optical Signal Processing: Just How Fast Can They Go?*, IEEE Lasers and Electro-Optics Society 1999 12th Annual Meeting, LEOS 1999, vol. 2, pp. 900-901, Nov. 8-11, 1999.
V.G. Mutalik et al., *Analog Performance of 1310-nm Gain-Clamped Semiconductor Optical Amplifiers*, OFC 1997 Technical Digest, pp. 266-267, 1997.
K. Panajotov et al., *Polarisation Switching in Proton-Implanted VCSELs*, 1999 Digest of the LEOS Summer Topical Meetings, pp. 55-56, Jul. 26-30, 1999.
B.C. Qui et al., *Monolithically Integrated Fabrication of 2×2 and 4×4 Crosspoint Switches Using Quantum Well Intermixing*, 2000 International Conference on Indium Phosphide and Related Materials, Conference Proceedings, pp. 415-418, May 14-18, 2000.
J. Scheuer et al., *Nonlinear On-Switching of High Spatial Frequency Patterns in Ring Vertical Cavity Surface Emitting Lasers*, 1999 IEEE LEOS Annual Meeting Conference Proceedings, 12th Annual Meeting, IEEE Lasers and Electro-Optics Society 1999 Annual Meeting, vol. 1, pp. 123-124, Nov. 8-9, 1999.
H. Soto et al., *All-Optical Switch Demonstration Using a Birefringence Effect in a Semiconductor Optical Amplifier*, IEEE CLEO, Pacific rim 1999, pp. 886-889, 1999.
C. Tai et al., *Dynamic Range and Switching Speed Limitations of an N×N Optical Packet Switch Based on Low-Gain Semiconductor Optical Amplifiers*, IEEE Journal of Lightwave Technology, vol. 14, No. 4, pp. 525-533, Apr. 4, 1996.
L.F. Tiemeijer et al., *High-Gain 1310 nm Semiconductor Optical Amplifier Modules with a Built-In Amplified Signal Monitor for Optical Gain Control*, IEEE Photonics Technology Letters, vol. 9, No. 3, pp. 309-311, Mar. 1997.
G. Toptchiyski et al, *Time-Domain Modeling of Semiconductor Optical Amplifiers for OTDM Applications*, IEEE Journal of Lightwave Technology, vol. 17, No. 12, pp. 2577-2583, Dec. 1999.
L.F. Tiemeijer et al., *Reduced Intermodulation Distortion in 1300 nm Gain-Clamped MQW Laser Amplifiers*, IEEE Photonics Technology Letters, vol. 7, No. 3, pp. 284-286, Mar. 1995.
R. van Roijen et al., *Over 15 dB Gain From a Monolithically Integrated Optical Switch with an Amplifier*, IEEE Photonics Technology letters, Vo. 5, No. 5, pp. 529-531, May 1993.
N. Yoshimoto et al., *Spot-Size Converted Polarization-Insensitive SOA Gate with a Vertical Tapered Submicrometer Stripe Structure*, IEEE Photonics Technology Letters, vol. 10, No. 4, pp. 510-512, Apr. 4, 1998.
J.D. Walker et al., *A Gain-Clamped, Crosstalk Free, Vertical Cavity Lasing Semiconductor Optical Amplifier for WDM Applications*, summaries of the papers presented at the topical meeting, Integrated Photonics Search; 1996 Technical Digest Series; Proceedings of Integrated Photonics; Boston, MA, USA, 29.04-02.05 1996, vol. 6, pp. 474-477.
B. Bauer et al., *Gain Stabilization of a Semiconductor Optical Amplifier by Distributed Feedback*, IEEE Photonics Technology Letters, vol. 6, No. 2, pp. 182-185, Feb. 1994.
S. Gee et al., *High-Power Mode-Locked External Cavity Semiconductor Laser Using Inverse Bow-Tie Semiconductor Optical Amplifiers*, IEEE Journal of Selected topics in Quantum Electronics, vol. 4, No. 2, pp. 209-215, Mar./Apr. 1998.
C.H. Joyner et al, *Extremely Large Band Gap Shifts for MQW Structures by Selective Epitaxy on $SiO_2$ Masked Substrates*, IEEE Photonics Technology Letters, vol. 4, No. 8, pp. 1006-1009, Sep. 1992.
F. Koyama et al., *Multiple-Quantum-Well GaInAs/GaInAsP Tapered Broad-Area Amplifiers with Monolithically Integrated Waveguide Lens for High-Power Applications*, IEEE Photonics Technology Letters, vol. 5, No. 8, pp. 916-919, Aug. 1993.

J.C. Simon et al., *Travelling Wave Semiconductor Optical Amplifier with Reduced Nonlinear Distortions*, Electronics Letters, vol. 30, No. 1, pp. 49-50, Jan. 6, 1994.

L.F. Tiemeijer et al., *1310-nm DBR-Type MQW Gain-Clamped Semiconductor Optical Amplifiers with AM-CATV-Grade Linearity*, IEEE Photonics Technology Letters, vol. 8, No. 11, pp. 1453-1455, Nov. 1996.

L.F. Tiemeijer et al., *High-Gain 1310 nm Semiconductor Optical Amplifier Modules with a Built-in Amplified Signal Monitor for Optical Gain Control*, IEEE Photonics Technology Letters, vol. 9, No. 3, pp. 309-311, Mar. 1997.

Agility Unveils Long-Haul Laser, Light-Reading—The Global Site for Optical Networking, retrieved from internet www.lightreading.com/document.asp, Mar. 30, 2001.

Wolfson et al., *Detailed Theoretical Investigation of the Input Power Dynamic Range for Gain-Clamped Semiconductor Optical Amplifier Gates at 10 Gb/s*, IEEE Photonics Technology Letters, 1998, vol. 10, No. 9, pp. 1241-1243.

F. Robert et al., *All-Optical Set-Rest Operation of a Bistable Semiconductor Laser Intracavity-Coupled to a Vertical-Cavity Surface-Emitting Laser*, IEEE Photonic Technology, Letters, vol. 12, No. 5, May 2000, pp. 465-467.

D.B. Shire et al., *Gain Controlled Vertical Cavity Surface Emitting Lasers Coupled with Intracavity In-plane Lasers*, Appl. Phys. Lett. vol. 66, No. 14, Apr. 3, 1995, pp. 1717-1719.

* cited by examiner

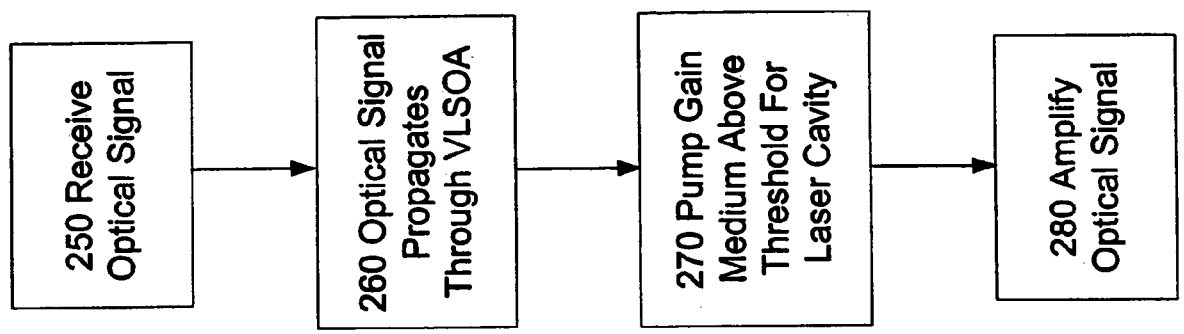

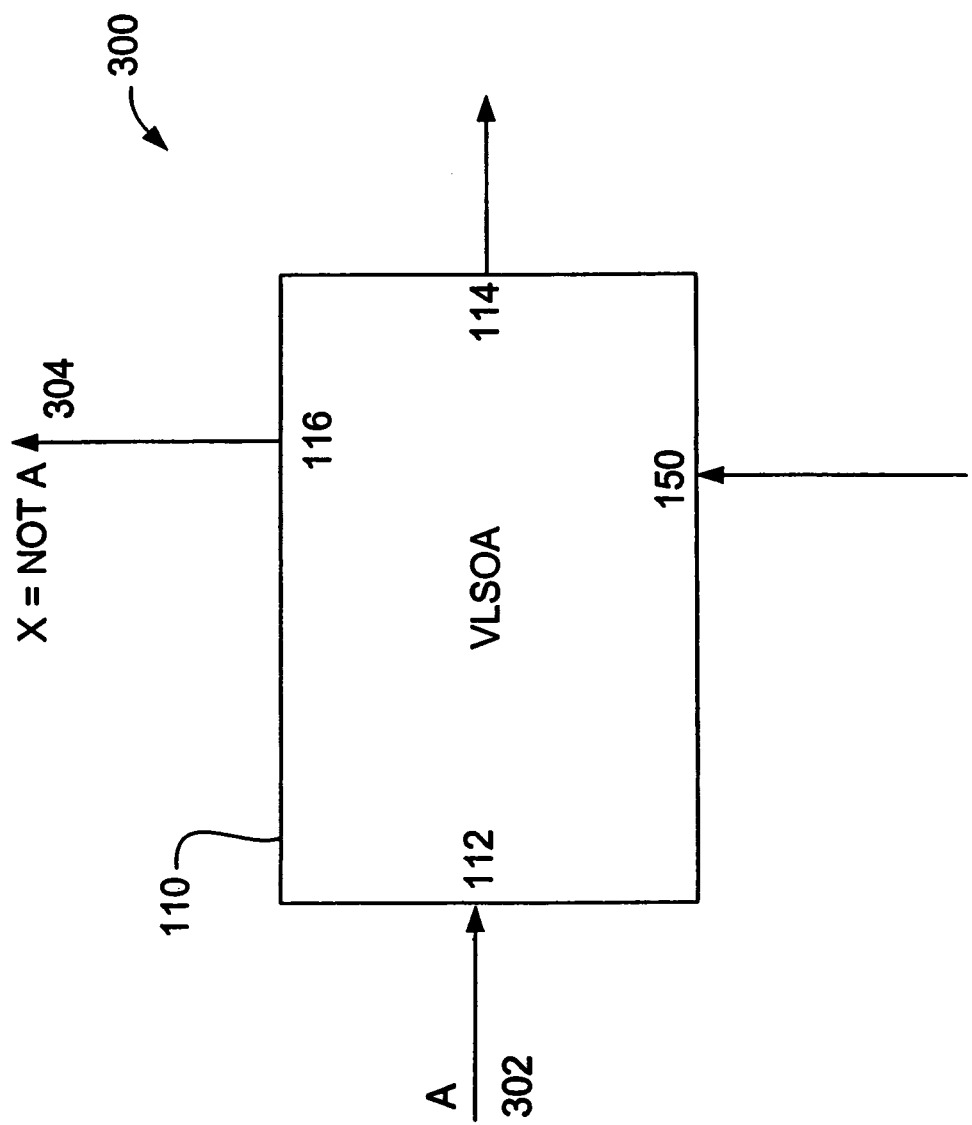

OPTICAL LATCH BASED ON LASING SEMICONDUCTOR OPTICAL AMPLIFIERS

RELATED APPLICATIONS

This application is a division, and claims the benefit, of U.S. patent application Ser. No. 10/020,558, entitled OPTICAL LOGIC CIRCUITS BASED ON LASING SEMICONDUCTOR OPTICAL AMPLIFIERS, filed Dec. 14, 2001 now U.S. Pat. No. 6,853,658 (the "'558 application") and incorporated herein in its entirety by this reference.

The '558 application, in turn, claims priority under 35 U.S.C. § 119(e) to the following three applications: U.S. Provisional Patent Application Ser. No. 60/255,753, entitled OPTICAL DEVICES INCLUDING A SEMICONDUCTOR OPTICAL AMPLIFIER, by Jeffrey D. Walker, Sol P. DiJaili, John M. Wachsman, Frank G. Paterson, and James A. Witham, filed Dec. 14, 2000; U.S. Provisional Patent Application Ser. No. 60/274,474, entitled OPTICAL ASTABLE MULTIVIBRATOR USING A VLSOA, by Sol P. DiJaili, filed Mar. 9, 2001; and, U.S. Provisional Patent Application Ser. No. 60/274,437, entitled FAST OPTICAL DIGITAL CIRCUITS, by Jeffrey D. Walker and Sol P. DiJaili, filed Mar. 9, 2001. All of the aforementioned applications are incorporated herein in their respective entireties by this reference.

BACKGROUND OF THE INVENTION

1. Field of the Invention

This invention relates generally to optical digital circuits, including latches and logic gates. More particularly, embodiments of the invention are concerned with optical latches based on devices such as lasing semiconductor optical amplifiers (LSOAs).

2. Description of Related Technologies

Digital electronics has revolutionized technology. Generally, in digital electronics, basic "building block" electronic digital circuits are combined to create more complicated and useful circuits, such as computer processors. These basic "building block" digital circuits include such well-known circuits as a NOT gate, a NOR gate, an OR gate, an AND gate, a NAND gate, a latch, and an astable multivibrator. Each of these electronic digital circuits is well known in the art.

However, the speed of electronic digital circuits is limited. For example, typical electronic digital circuits comprise transistors, which turn on and off. The transitions between on and off for each transistor takes time. Thus, electronic digital circuits limit a system's speed. In general, optical systems are capable of greater speed than electronic systems. Therefore, it is desirable to have optical digital circuits.

In addition, the use of electronic digital circuits in optical systems has drawbacks. For example, optical communication systems are capable of quickly moving large amounts of data. Frequently, it is desirable to use digital circuits in these optical communication systems. When electronic circuits are use in optical systems, the optical signal is converted into an electronic signal. After processing by the electronic circuits, the signal is reconverted to an optical signal. This conversion and re-conversion requires extra components, which add cost and size to the system. Further, the use of electronic components limits the speed of the system to the speed of the electronics, rather than allowing the system to take advantage of the speed of optical circuits.

SUMMARY OF THE INVENTION

The present invention is optical logic devices. The optical logic devices are analogous to electrical logic devices, but operate with light, rather than electrons.

One embodiment is an optical NOT gate, which inverts an input optical signal. The input optical signal is received at an amplifier input of a lasing semiconductor optical amplifier (LSOA). The laser output of the LSOA is used as the output of the optical NOT gate. The laser output outputs an optical signal that is the inversion of the input optical signal. Thus, the LSOA functions as an optical NOT gate.

Another embodiment is an optical astable multivibrator. An LSOA and a time delay are used to form the optical astable multivibrator. The laser output of the LSOA is connected to the input of the time delay. The output of the time delay is connected to the input of the LSOA. This looping of the LSOA laser output through the time delay back to the LSOA input causes the amplifier output of the LSOA to output a clock signal. The frequency of this clock signal can be varied by changing the distance between mirrors in the LSOA, changing the index of refraction of a tunable layer in the LSOA, changing the index of refraction of a layer within the time delay, or through other methods.

Another embodiment is an optical RS latch. Two LSOAs are used in the optical RS latch. A first, set, input is connected to the input of a first LSOA. The laser output of the first LSOA is used as a first, Qbar, output of the optical RS latch. The laser output of the first LSOA is also connected to the input of a second LSOA, via a splitter and a combiner. A second, reset, input is connected to the input of the second LSOA. The laser output of the second LSOA is used as a second, Q, output of the optical RS latch. The laser output of the second LSOA is also connected to the input of the first LSOA, via a splitter and a combiner. In operation, the optical RS latch has two stable states. If a high signal is applied to the set input while the reset input receives no signal or a low signal, the first stable state is reached. In the first stable state, the Q output is high and the Qbar output is low. If the high signal is removed from the set input, the RS latch remains in this state, with the Q output high and the Qbar output low. If a high signal is applied to the reset input while the set input receives no signal or a low signal, the second stable state is reached. In the second stable state, the Qbar output is high and the Q output is low. If the high signal is removed from the reset input, the RS latch remains in this state, with the Qbar output high and the Q output low.

Another embodiment is an optical NAND gate. A first input is input to the amplifier input of a first VLSOA. A second input is input to the amplifier input of a second VLSOA. The laser outputs of the two VLSOAs are combined to form the NAND gate output.

Another embodiment is an optical NOR gate. A first input and second input are combined and sent to the amplifier input of a VLSOA. The laser output of the VLSOA is used as the NOR gate output.

Other embodiments include combinations of some of the above embodiments. By combining various optical logic devices, more complex optical logic circuits, such as AND and OR gates, are created. One embodiment of such a complicated optical logic circuit is an optical clocked latch. The optical clocked latch includes an optical RS latch, and two optical AND gates. A first input and a clock signal are input to a first optical AND gate. The output of the first optical AND gate is connected to the set input of the optical RS latch. A second input and the clock signal are input to a second optical AND gate. The output of the second optical AND gate is connected to the reset input of the optical RS latch. The Q output of the optical RS latch is the output of the optical clocked latch.

BRIEF DESCRIPTION OF THE DRAWINGS

The invention has other advantages and features which will be more readily apparent from the following detailed description of the invention and the appended claims, when taken in conjunction with the accompanying drawing, in which:

FIG. 2D is a flow diagram illustrating operation of a VLSOA.

FIG. 3B is a block diagram of an embodiment of the optical NOT gate.

DETAILED DESCRIPTION OF THE PREFERRED EMBODIMENTS

Each of the described embodiments of optical logical devices comprises a vertical lasing semiconductor optical amplifier (VLSOA). Thus, the VLSOA is described first, followed by sections describing various optical logical devices. One advantage of implementing optical digital circuitry or devices using VLSOAs is that the optical logical devices are fast compared to other semiconductor-based optical implementations. This is because a high intensity field (laser or injected) is present in the VLSOA. This speeds up the processes within the gain medium of the VLSOA, increasing the switching speed of the VLSOA.

Although the described embodiments include VLSOAs, other devices can be used in other embodiments. For example, transverse lasing SOAs (in which the laser cavity is oriented transversely with respect to the amplifying path), other lasing SOAs in which the laser cavity is off-axis with respect to the amplifying path, or longitudinal lasing SOAs in which the laser cavity is aligned with respect to the amplifying path may all be used in place of some or all of the VLSOAs. In such devices, the lasing signal may be made distinct from the amplified signal by polarization, wavelength, propagation direction, or other method to separate the lasing and amplified signals.

Figure 1:
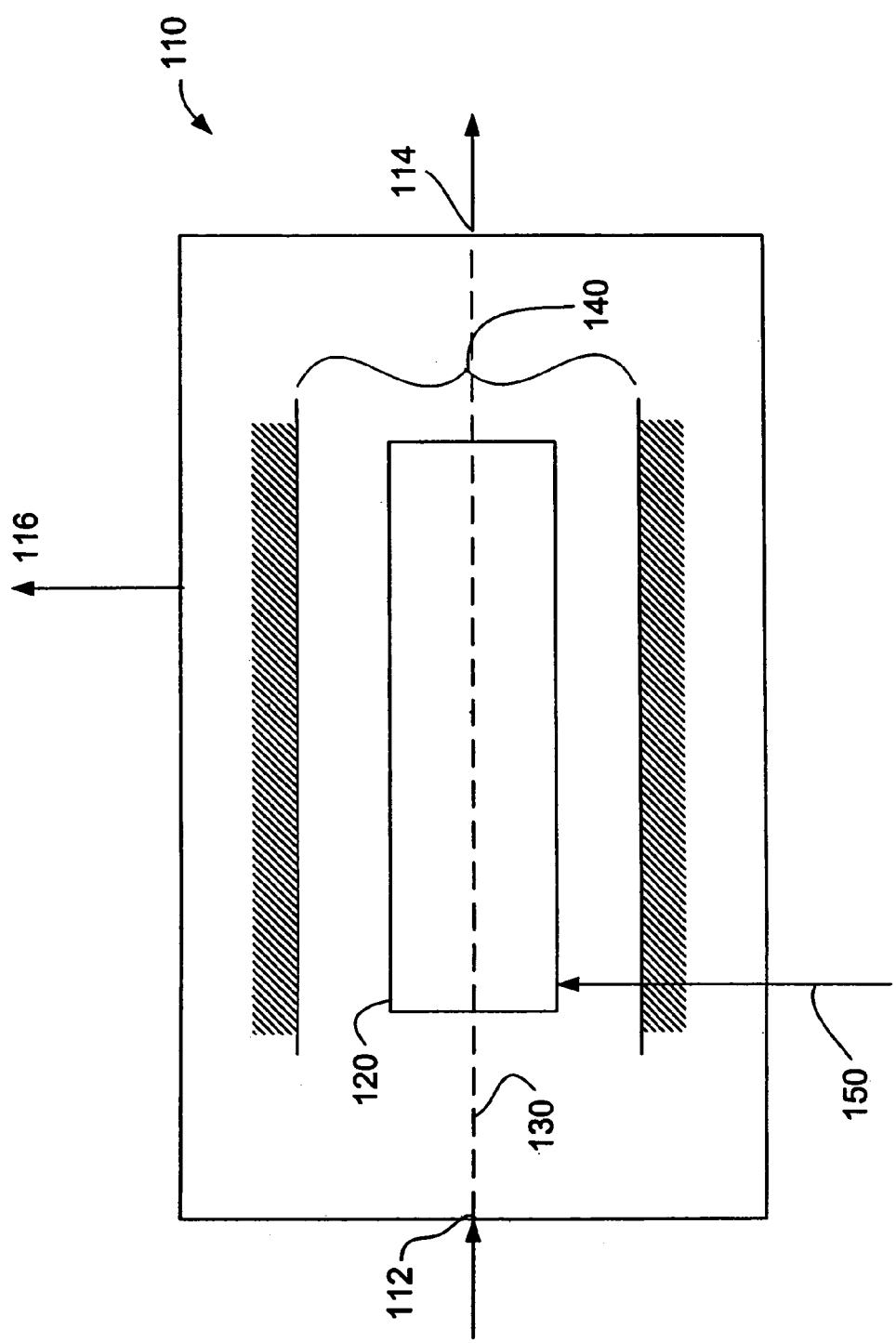
FIG. 1 is a diagram of a vertical lasing semiconductor optical amplifier (VLSOA) in accordance with the present invention.

Vertical Lasing Semiconductor Optical Amplifier:

FIG. 1 is a diagram of a vertical lasing semiconductor optical amplifier (VLSOA) 110 in accordance with the present invention. The VLSOA 110 has an amplifier input 112 and an amplifier output 114. The VLSOA 110 further includes a semiconductor gain medium 120, with an amplifying path 130 coupled between the amplifier input 112 and the amplifier output 114 of the VLSOA 110 and traveling through the semiconductor gain medium 120. The VLSOA 110 further includes a laser cavity 140 including the semiconductor gain medium 120, and a pump input 150 coupled to the semiconductor gain medium 120. The laser cavity 140 is oriented vertically with respect to the amplifying path 130. The pump input 150 is for receiving a pump to pump the semiconductor gain medium 120 above a lasing threshold for the laser cavity 140. When pumped, the laser cavity 140 generates a laser signal, which shall be referred to as the ballast laser signal. The VLSOA 110 further includes a ballast laser output 116 through which the ballast laser signal exits the VLSOA 100.

Figure 2A:
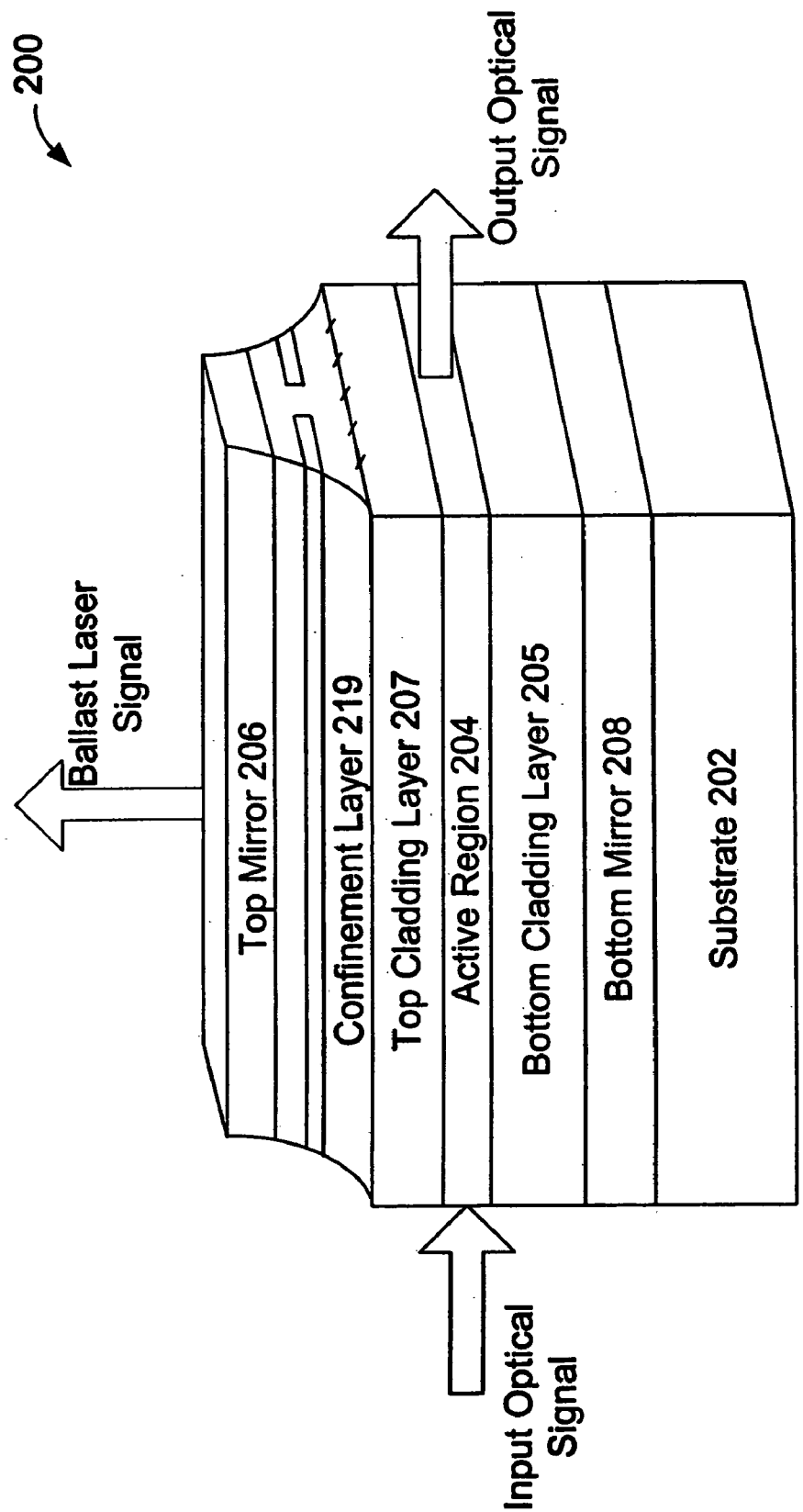
FIG. 2A is a perspective view of an embodiment of a vertically lasing semiconductor optical amplifier (VLSOA).
Figure 2B:
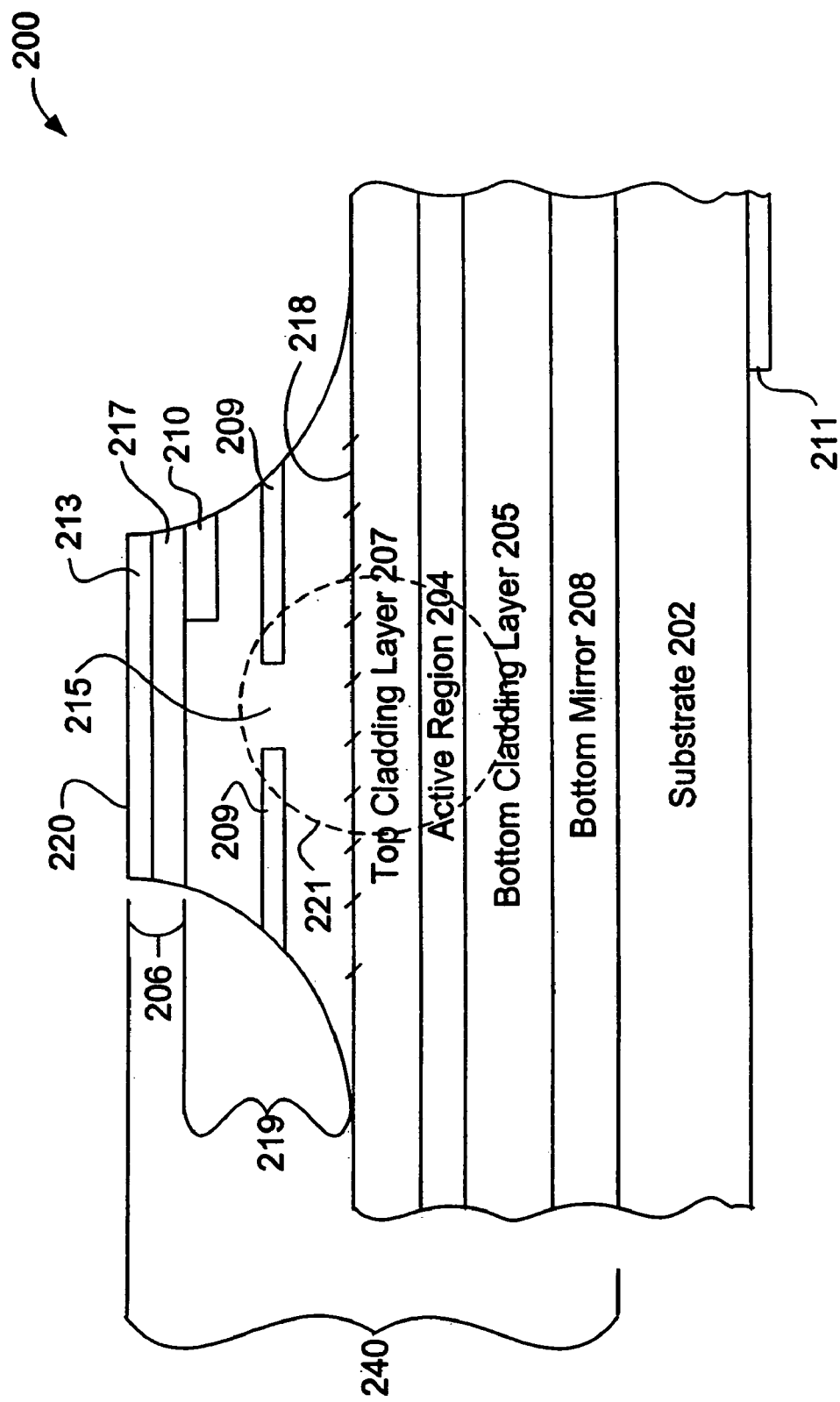
FIG. 2B is a transverse cross-sectional view of an embodiment of a vertically lasing semiconductor optical amplifier (VLSOA).
Figure 2C:
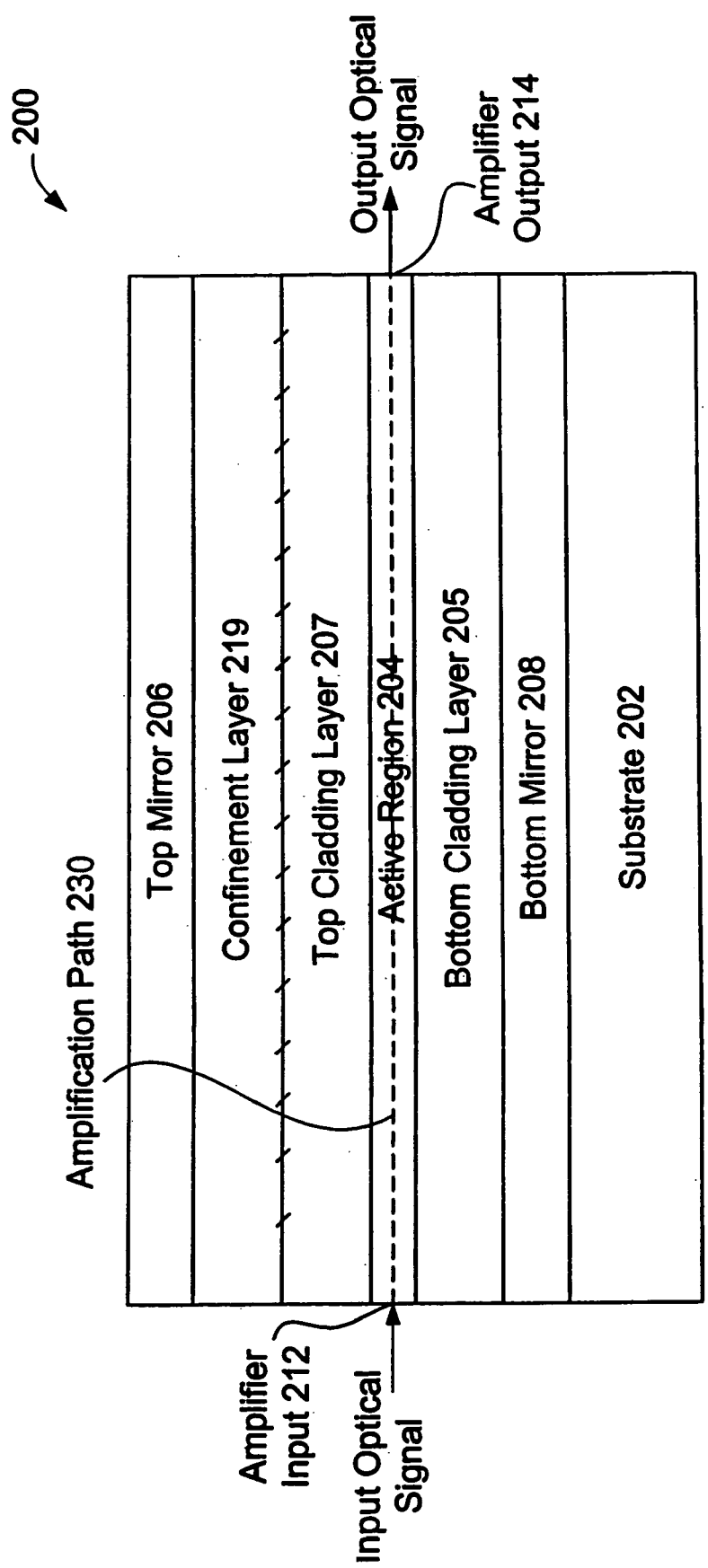
FIG. 2C is a longitudinal cross-sectional view of an embodiment of a vertically lasing semiconductor optical amplifier (VLSOA).

FIGS. 2A–2C are a perspective view, transverse cross-section, and longitudinal cross-section, respectively, of an embodiment of a VLSOA 200 according to the present invention, with FIG. 2B showing the most detail.

Referring to FIG. 2B and working from bottom to top in the vertical direction (i.e., working away from the substrate 202), VLSOA 200 includes a bottom mirror 208, bottom cladding layer 205, active region 204, top cladding layer 207, confinement layer 219, and a top mirror 206. The bottom cladding layer 205, active region 204, top cladding layer 207, and confinement layer 219 are in electrical contact with each other and may be in direct physical contact as well. An optional delta doping layer 218 is located between the top cladding layer 207 and confinement layer 219. The confinement layer 219 includes a confinement structure 209, which forms aperture 215. The VLSOA 200 also includes an electrical contact 210 located above the confinement structure 209, and a second electrical contact 211 formed on the bottom side of substrate 202.

Comparing to FIG. 1, the semiconductor gain medium 120 includes the active region 204 and the laser cavity 140 is formed primarily by the two mirrors 206 and 208 and the active region 204. This embodiment is electrically pumped so the pump input 150 includes the electrical contacts 210, 211. The ballast laser output 116 is a portion of the top surface 220 of the VLSOA 200.

VLSOA 200 is a vertical lasing semiconductor optical amplifier since the laser cavity 240 is a vertical laser cavity. That is, it is oriented vertically with respect to the amplifying path 230 and substrate 202. The VLSOA 200 preferably is long in the longitudinal direction, allowing for a long amplifying path 230 and, therefore, more amplification. The entire VLSOA 200 is an integral structure formed on a single substrate 202 and may be integrated with other optical elements. In most cases, optical elements which are coupled directly to VLSOA 200 will be coupled to the amplifying path 230 within the VLSOA. Depending on the manner of integration, the optical input 212 and output 214 may not exist as a distinct structure or facet but may simply be the boundary between the VLSOA 200 and other optical elements. Furthermore, although this disclosure discusses the VLSOA 200 primarily as a single device, the teachings herein apply equally to arrays of devices.

VLSOA 200 is a layered structure, allowing the VLSOA 200 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 200 is confined in the vertical direction by index differences between bottom cladding 205, active region 204, and top cladding 207, and to a lesser extent by index differences between the substrate 202, bottom mirror 208, confinement layer 219, and top mirror 206. Specifically, active region 204 has the higher index and therefore acts as a waveguide core with respect to cladding layers 205,207. The optical signal is confined in the transverse direction by index differences between the confinement structure 209 and the resulting aperture 215. Specifically, aperture 215 has a higher index of refraction than confinement structure 209. As a result, the mode of the optical signal to be amplified is generally concentrated in dashed region 221. The amplifying path 230 is through the active region 204 in the direction in/out of the plane of the paper with respect to FIG. 2B.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In a preferred embodiment, the VLSOA 200 is optimized for the 1.55 micron window.

In one embodiment, the active region 204 includes a multiple quantum well (MQW) active region. MQW structures include several quantum wells and quantum wells have the advantage of enabling the formation of lasers with relatively low threshold currents. In alternate embodiments, the active region 204 may instead be based on a single quantum well or a double-heterostructure active region. The active region 204 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 205 and 207 will depend in part on the composition of active region 204.

Examples of top and bottom mirrors 206 and 208 include Bragg reflectors and non-Bragg reflectors such as metallic mirrors. Bottom mirror 208 in FIG. 2 is shown as a Bragg reflector. Top mirror 206 is depicted as a hybrid mirror, consisting of a Bragg reflector 217 followed by a metallic mirror 213. Bragg reflectors may be fabricated using various materials systems, including for example, alternating layers of GaAs and AlAs, $SiO_2$ and $TiO_2$, InAlGaAs and InAlAS, InGaAsP and InP, AlGaAsSb and AlAsSb or GaAs and AlGaAs. Gold is one material suitable for metallic mirrors.

The electrical contacts 210,211 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 210,211 into the active region 204. In particular, contact 210 is a p-type contact to inject holes into active region 204, and contact 211 is an n-type contact to inject electrons into active region 204. Contact 210 is located above the semiconductor structure (i.e., above confinement layer 219 and the semiconductor part of Bragg reflector 217, if any) and below the dielectric part of Bragg reflector 217, if any. For simplicity, in FIG. 2, contact 210 is shown located between the confinement layer 219 and Bragg reflector 217, which would be the case if Bragg reflector 217 were entirely dielectric. VLSOA 200 may have a number of isolated electrical contacts 210 to allow for independent pumping within the amplifier. This is advantageous because VLSOA 200 is long in the longitudinal direction and independent pumping allows, for example, different voltages to be maintained at different points along the VLSOA. Alternately, the contacts 210 may be doped to have a finite resistance or may be separated by finite resistances, rather than electrically isolated.

Confinement structure 209 is formed by wet oxidizing the confinement layer 219. The confinement structure 209 has a lower index of refraction than aperture 215. Hence, the effective cross-sectional size of laser cavity 240 is determined in part by aperture 215. In other words, the confinement structure 209 provides lateral confinement of the optical mode of laser cavity 240. In this embodiment, the confinement structure 209 also has a lower conductivity than aperture 215. Thus, pump current injected through electrical contact 210 will be channeled through aperture 215, increasing the spatial overlap with optical signal 221. In other words, the confinement structure 209 also provides electrical confinement of the pump current.

Referring again to FIG. 1, the four basic input and output ports of VLSOA 110 are the amplifier input 112 to the amplifying path 130, the amplifier output 114 of the amplifying path 130, a pump input 150 for pumping the semiconductor gain medium 150, and a ballast laser output 116 for the laser mode of the laser cavity 140.

In various embodiments of optical logic devices, various components may be coupled by waveguides, coupled directly to each other, coupled by fibers or coupled using free space systems (e.g., lenses and/or mirrors). Further, the VLSOA may be integrated with other optical elements to form the optical logic devices.

The integration of VLSOAs 110 with other optical elements may be implemented using any number of techniques. In one approach, both the VLSOA 110 and the other optical element are formed using a common fabrication process on a common substrate, but with at least one parameter varying between the VLSOA and the optical element. For example, selective area epitaxy (SAE) and impurity induced disordering (IID) are two fabrication processes which may be used in this manner.

In one approach based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide, with the difference in transition energy accounting for the different optical properties of the active region and the transparent core. SAE is particularly advantageous because it results in a smooth interface between optical elements and therefore reduces optical scattering at this interface, This, in turn, reduces both parasitic lasing modes and gain ripple. Furthermore, the SAE approach can be confined to only the minimum number of layers necessary (e.g., only the active region), thus minimizing the impact on the rest of the integrated optical device.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide, with the difference in transition energy again accounting for the different optical properties.

In the previous SAE and IID examples, the difference in transition energy results in different optical properties between the VLSOA active region and a waveguide. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent.

In a different approach, the VLSOA and the optical element are formed on a common substrate but using different fabrication processes. In one example, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. Continuing the VLSOA and waveguide example from above, materials are deposited to form the VLSOA (or at least a portion of the VLSOA). In the areas where the waveguide is to be located, these materials are removed and additional materials are deposited to form the waveguide (or at least a portion of it).

In yet another approach, the VLSOA and the optical element are formed on separate substrates by separate fabrication processes and then integrated onto a common substrate. Planar lightwave circuitry and silicon optical bench are two examples of processes following this approach. In one example, the VLSOA is formed on a first substrate. The optical element is formed on a second substrate. The VLSOA and the optical element are then integrated onto a common substrate, which could be the first substrate, the second substrate or a completely different substrate.

The operation of the VLSOA 110 as an amplifier illustrates the basic physics underlying the VLSOA 110. Referring to FIG. 2D, the VLSOA 110 receives 250 an optical signal at its amplifier input 112. The optical signal propagates 260 along the amplifying path 130. The pump received at pump input 150 pumps 270 the semiconductor gain medium above a lasing threshold for the laser cavity 140. When lasing occurs, the round-trip gain offsets the round-trip losses for the laser cavity 140. In other words, the gain of the semiconductor gain medium 120 is clamped to the gain value necessary to offset the round-trip losses. The optical signal is amplified 280 according to this gain value as it propagates along the amplifying path 130 (i.e., through the semiconductor gain medium 120). The amplified signal exits the VLSOA 110 via the amplifier output 114. The ballast laser signal from the laser cavity 140 exits the VLSOA 110 via the ballast laser output 116. Note that there are two optical outputs for the VLSOA: the amplifier output 114 and the ballast laser output 116. When operated as an amplifier, the VLSOA 110 can be used as a gain element in optical circuits. Other gain elements, which provide optical amplification are also possible.

Figure 3A:
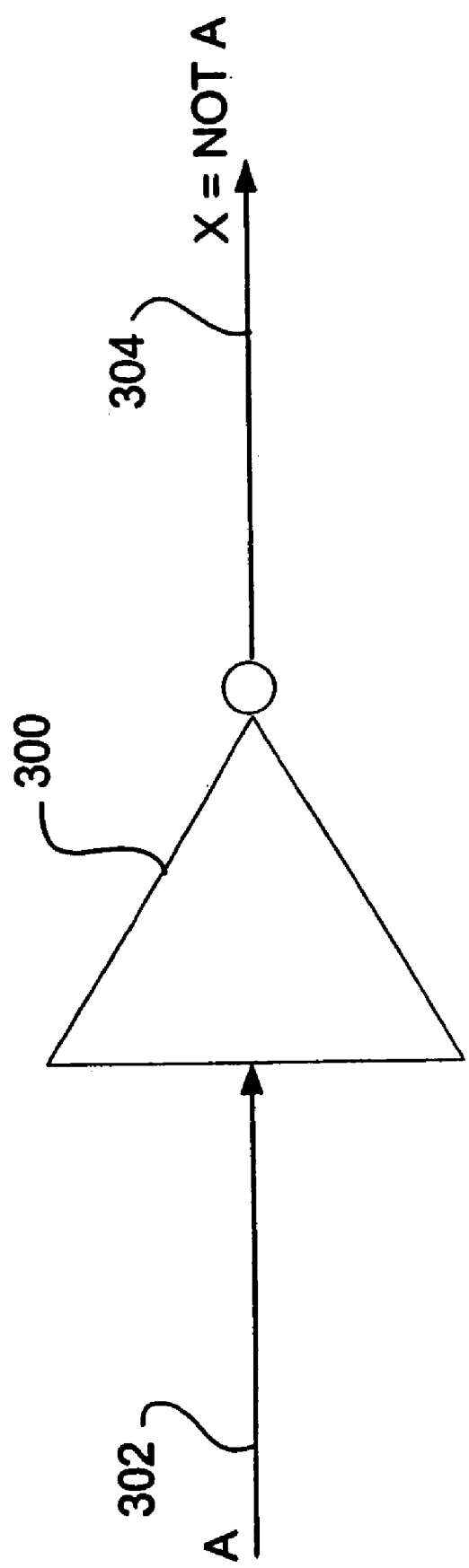
FIG. 3A is a representation of an optical NOT gate.

NOT Gate (Inverter):

FIG. 3A is a representation of an optical NOT gate 300. Similar in function to an electronic NOT gate, an optical NOT gate 300 inverts a received input signal. The input signal A enters the optical NOT gate 300 via input 302. The output 304 outputs a signal X that is the input signal A inverted. As is the case with all of the optical digital circuits described, both the input signal A and output signal X are optical in form. They are also digital signals in the sense that each signal represents either a 0 or a 1. In the examples given, signals which are above a threshold intensity are interpreted as a 1; whereas those below the threshold intensity are interpreted as a 0.

FIG. 3B is a block diagram of one embodiment of the optical NOT gate 300. The optical NOT gate 300 comprises a VLSOA 110. The NOT gate input 302 is connected to the amplifier input 112 of the VLSOA 110. The laser output 116 of the VLSOA 110 is connected to the NOT gate output 304. The pump input 150 acts as a power source. The amplifier output 114 is generally discarded in the optical NOT gate 300.

The optical NOT gate 300 takes advantage of the fact that, in the VLSOA 110, the laser signal exiting the laser output 116 acts as a ballast. In other words, if the amplified signal on amplifier output 114 is strong, the ballast laser signal on output 116 will be weak. But if the amplifier signal on 114 is weak, the ballast laser signal on 116 will be strong. Hence, if a digital "0", an optical signal that is weak or nonexistent, is input to the amplifier input 112, the resulting amplified signal on amplifier output 114 will still be relatively weak and the ballast laser signal on 116 will be strong (a digital "1"). Conversely, if a digital "1", a strong signal, is input to the amplifier input 112, the resulting amplified signal on 114 will also be strong and the ballast laser signal on 116 will be weak or nonexistent (digital "0"). Taken to an extreme, if no signal is input to the amplifier input 112 of the VLSOA 110, there will be no amplified output 114 and the ballast laser signal on 116 will have its maximum strength. On the other hand, if a sufficiently strong signal is input to the amplifier input 112 of the VLSOA, the gain region of the VLSOA 110 will be deleted and lasing will be extinguished, resulting in no ballast laser signal form output 116. Hence, the VLSOA 110 operates as an inverter. For digital logic gates, it is preferable a digital 1 at the input 302 have the save intensity level as a digital 1 at the output 304, and the same for digital 0. In this way, digital logic gates can be cascaded without requiring intermediate regenerative devices.

With respect to the example of FIG. 3B, this can be achieved in the design of the VLSOA 110 and/or by the use of additional elements coupled to the VLSOA 110. For example, the relationship between the ballast laser signal (representing X) and the incoming optical signal (representing A) depends in part on the internal design of VLSOA 110. Variations in the semiconductor gain medium 120, laser cavity 140 and other parameters can be used to tailor this relationship. Changing the location and/or size of the ballast lash output 116 will also affect this relationship. All else being equal, increasing the pump power will increase the strength of the ballast laser signal for a given incoming optical signal. Finally, gain devices such as additional amplifier or attenuators can be used to adjust intensity levels.

Figure 4A:
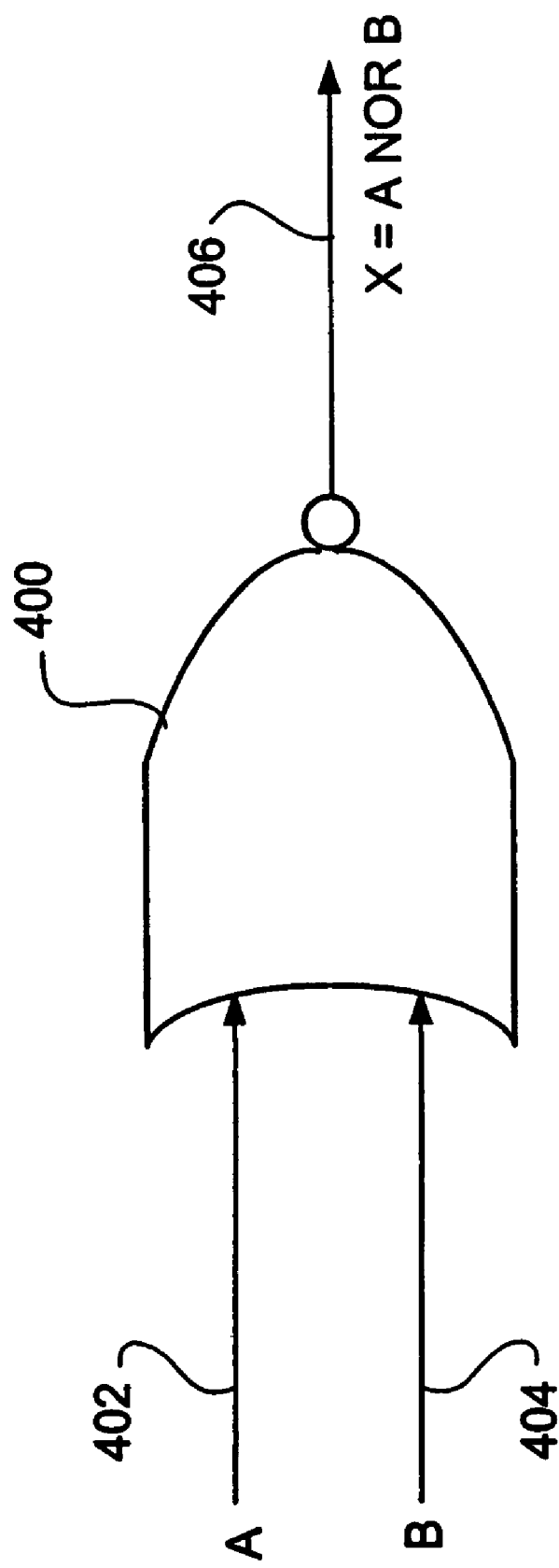
FIG. 4A is a representation of an optical NOR gate.

NOR Gate:

FIG. 4A is a representation of an embodiment of an optical NOR gate 400. An optical NOR gate 400 is similar in function to an electronic NOR gate, but operates with optical signals instead of electrical signals. The input signals A and B enter the optical NOR gate 400 on two inputs 402 and 404. The output 406 then outputs a signal X that is based on the values of the input signals. If both of the signals A and B on the inputs 402 and 404 are 0, then the signal X on the output 406 is 1. If either or both of the signals A and B on the inputs 402 and 404 are 1, the signal X on the output 406 is 0.

Figure 4B:
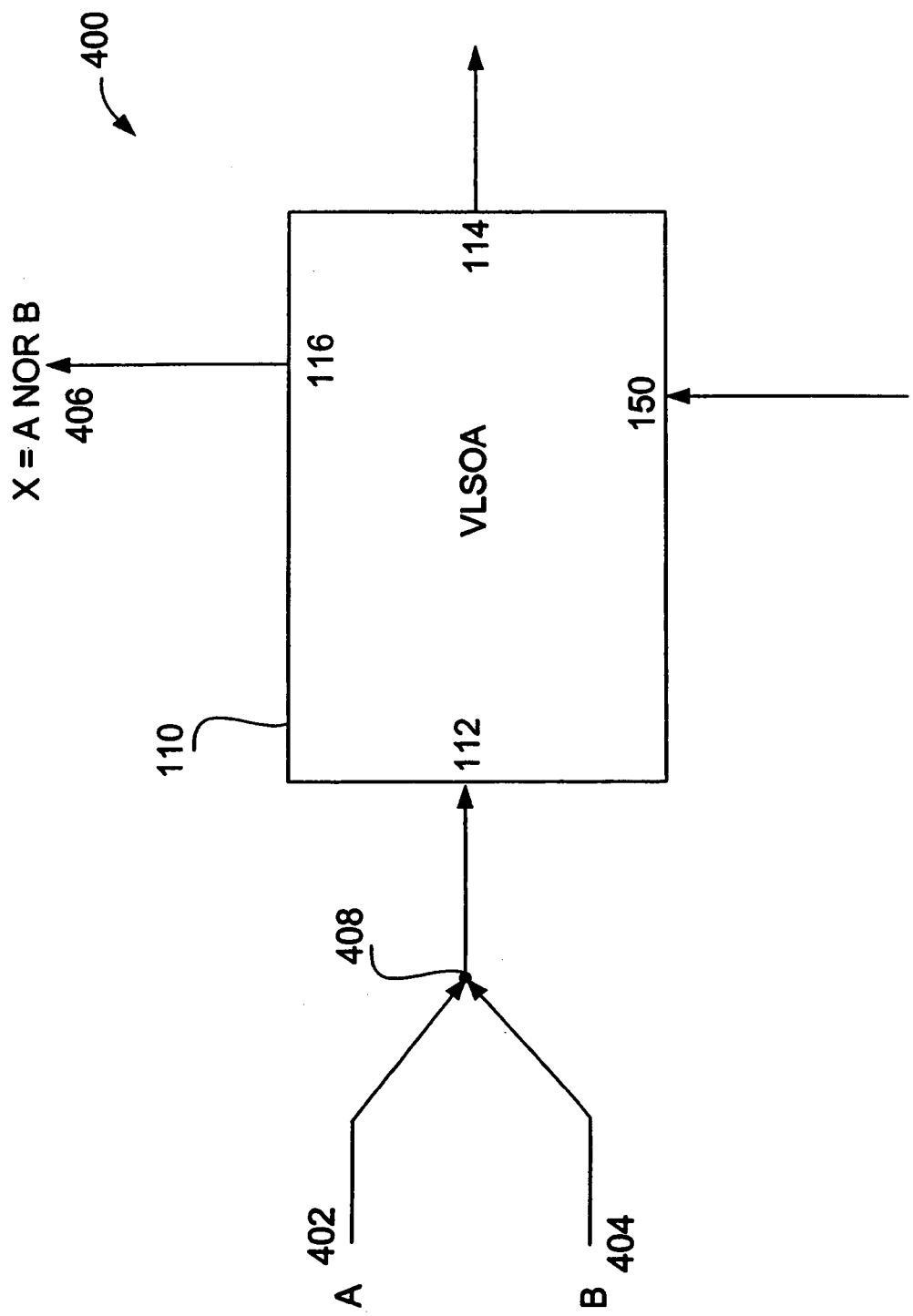
FIG. 4B is a block diagram of an embodiment of the optical NOR gate.

FIG. 4B is a block diagram of an embodiment of the optical NOR gate 400. The optical NOR gate 400 comprises a combiner 408 coupled to a VLSOA 110. The two NOR gate inputs 402 and 404 are connected to inputs of the combiner 408, and the combined signal from the two inputs 402 and 404 are sent to the amplifier input 112 of the VLSOA 110. The laser output 116 of the VLSOA 110 is connected to the NOR gate output 406. The pump input 150 acts as a power source. The amplifier output 114 is generally discarded in the optical NOR gate 400. In some embodiments, the wavelengths or polarizations or both of the two input signals on inputs 402 and 404 are different, to help avoid potential destructive interference at combiner 408. In some embodiments, this is accomplished by ensuring different wavelengths are output from previous stages to be received by inputs 402 and 404. The wavelengths or polarizations or both of the inputs to other combiners in the various figures discussed above and below are also different, in some embodiments.

The optical NOR gate 400 takes advantage of the fact that, in the VLSOA 110, the ballast laser signal on 116 acts as a ballast. If a weak signal (a digital "0") is input to the amplifier input 112, the semiconductor gain medium 120 will not be near depleted by the optical signal on the amplifying path 130 (i.e., it will be well below the depletion threshold) and the ballast laser signal on 116 will be strong (a digital "1"). Conversely, if a strong signal (digital "1") is input to the amplifier input 112, the semiconductor gain medium 120 will be near or beyond depletion and the ballast laser signal on 116 will be weak or extinguished (digital "0"). The depletion threshold of the VLSOA 110 is set so that only one of the optical signals A and B must be strong (a digital "1") in order to deplete the semiconductor gain medium 120, thus resulting in a weak or extinguished ballast laser signal X (a digital "0"). If none of the inputs is strong, the VLSOA 110 is not sufficiently depleted and a strong ballast laser signal X (a digital "1") results. Thus, NOR functionality is implemented.

The depletion threshold of the VLSOA 110 may be set in a number of different ways. For example, varying the gain of the VLSOA 110 will vary the depletion threshold. A higher gain means that depletion will be achieved by a weaker signal at the amplifier input 112, since the weaker signal at the amplifier input 112 will be amplified more while propagating through the VLSOA 110. In other words, increasing the gain of the VLSOA 110 reduces the depletion threshold. As another example, the amount of laser ballast itself may be varied by varying how much the VLSOA 110 is pumped. Pumping the VLSOA 110 harder results in a stronger laser ballast, which in turn will require more depletion before toggling. Thus, pumping harder increases the depletion threshold.

Thus, the depletion threshold of the VLSOA 110 in the optical NOR gate 400 is set low enough that a high signal on either of the inputs 402 and 404 is enough to weaken or extinguish the ballast laser output of the VLSOA 110 so the output 406 of the optical NOR gate 400 is low. When either or both of the inputs 402 and 404 are high, the output 406 of the optical NOR gate 400 is low. When neither of the inputs 402 and 404 carries a high signal, the output 406 of the optical NOR gate 400 is high.

Figure 5A:
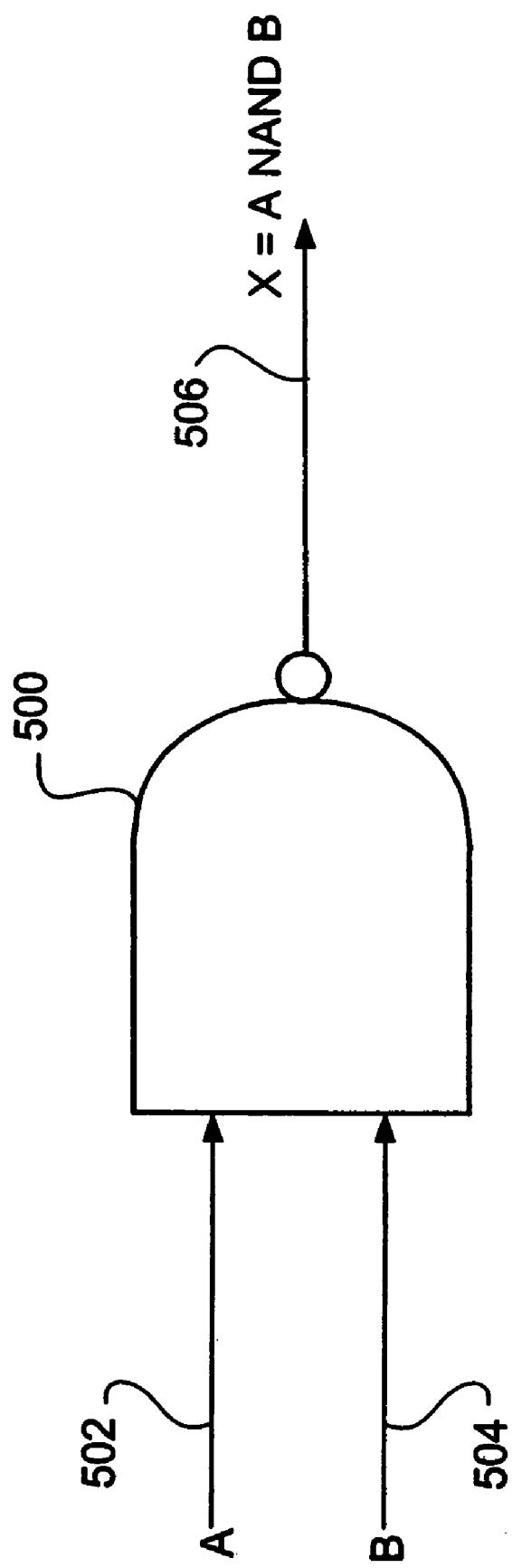
FIG. 5A is a representation of an optical NAND gate.

NAND Gate:

FIG. 5A is a representation of an optical NAND gate 500. An optical NAND gate 500 is similar in function to an electronic NAND gate, but operates with optical signals instead of electrical signals. The input signals A and B enter the optical NAND gate 500 on two inputs 502 and 504. The output 506 then outputs a signal X that varies based on the values of the input signals. If both of the signals A and B on the inputs 502 and 504 are high, then the signal X on the output 506 is low. If either or both of the signals A and B on the inputs 502 and 504 are low, the signal X on the output 506 is high.

Figure 5B:
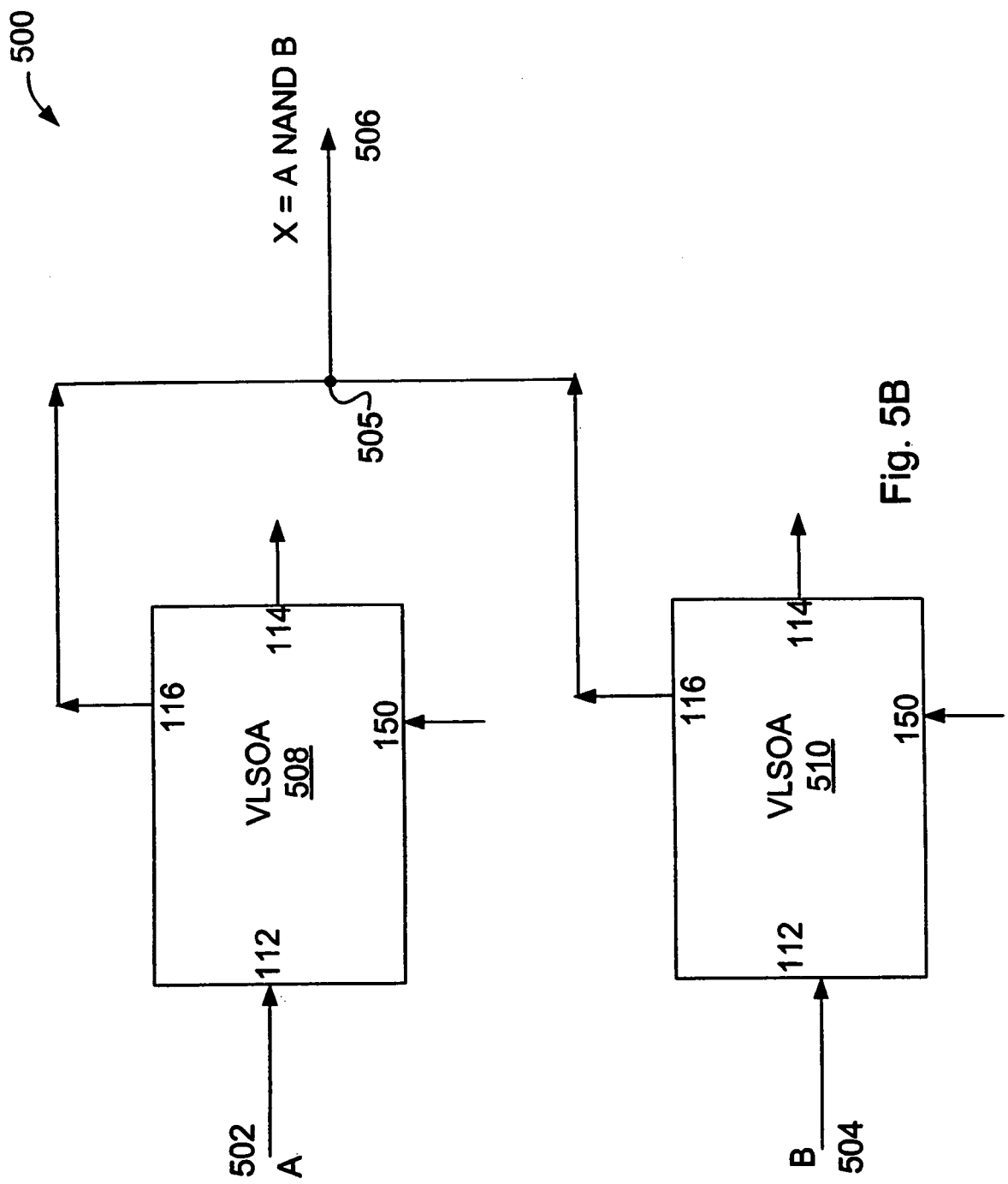
FIG. 5B is a block diagram of an embodiment of the optical NAND gate.

FIG. 5B is a block diagram of one embodiment of the optical NAND gate 500. The optical NAND gate 500 comprises two VLSOAs 508 and 510. The two NAND gate inputs 502 and 504 are connected to the amplifier inputs 112 of the two VLSOAs 508 and 510, respectively. The laser outputs 116 of the two VLSOAs 508 and 510 are combined by combiner 505 and sent to the NAND gate output 506. The pump inputs 150 of the VLSOAs 508 and 510 act as power sources. The amplifier outputs 114 of the two VLSOAs 508 and 510 are generally discarded in the optical NAND gate 500. In some embodiments, the wavelengths or polarizations or both of the two laser outputs 116 of the two VLSOAs 508 and 510 are different, to help avoid potential destructive interference at combiner 505. In some embodiments, this is accomplished by ensuring different wavelengths are output from the two laser outputs 116 of the two VLSOAs 508 and 510.

The optical NAND gate 500 takes advantage of the fact that, in the VLSOAs 508 and 510, the ballast laser signals on the laser outputs 116 act as ballast. If a weak signal (a digital "0") is input to one of the amplifier inputs 112, the semiconductor gain medium 120 will not be near depleted by the optical signal on the amplifying path 130 (i.e., it will be well below the depletion threshold) and the ballast laser signal on 116 will be strong (a digital "1"). Conversely, if a strong signal (digital "1") is input to one of the amplifier inputs 112, the semiconductor gain medium 120 will be near or beyond depletion and the ballast laser signal on 116 will be weak or extinguished (digital "0"). The strong signal of either of the VLSOAs 508 or 510 is a strong signal (digital "1") at the output 506. Thus, if either or both of the VLSOAs output a strong signal from one of the laser outputs 116, the output X of the optical NAND gate 500 is strong. Only if both of the laser outputs 116 of the two VLSOAs 508 and 510 are weak will the output X be weak. This occurs when both of the inputs A and B are strong. Thus, NAND functionality is implemented.

Figure 6:
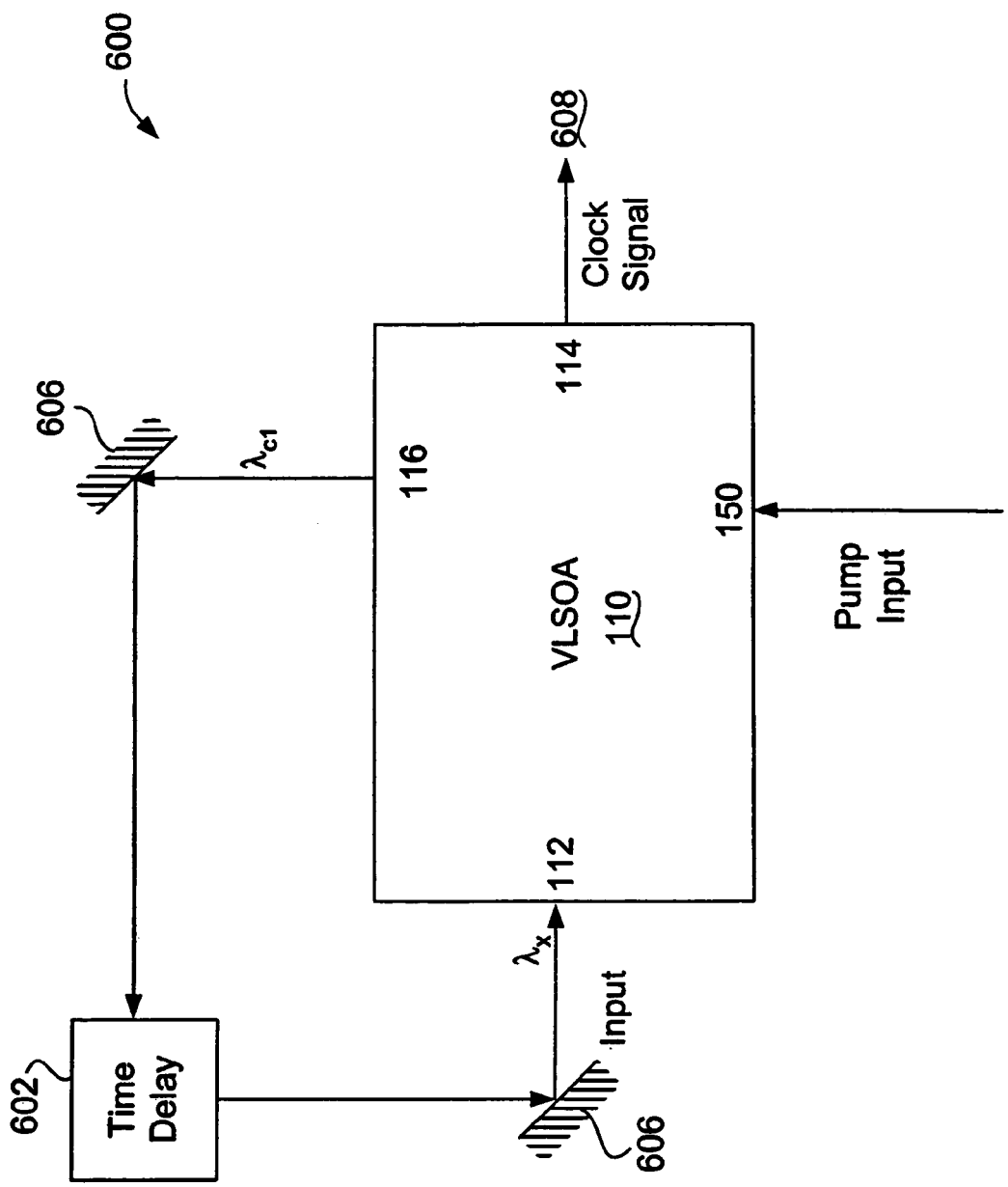
FIG. 6 is a block diagram of an optical astable multivibrator.

Astable Multivibrator:

FIG. 6 is a block diagram of an optical astable multivibrator 600 which includes a VLSOA 110. The ballast laser output 116 of the VLSOA 110 is coupled to a time delay 602, for example by mirrors 606, wave guides, or other conventional devices. The output of the time delay 602 is coupled to the amplifier input 112 of the VLSOA 110, again by using mirrors 606, wave guides, or other conventional devices. The time delay 602 creates a time lag between the time a signal leaves the ballast laser output 116 of the VLSOA 110 and the time the signal reenters the VLSOA 110 at the amplifier input 112. The amplifier output 114 of the VLSOA 110 is the output signal 608 of the astable multivibrator 600.

The VLSOA 110 operates as an inverter as discussed above with respect to the optical NOT gate 300. The ballast laser signal from 116 of the VLSOA 110 is the inverse of the optical signal at amplifier input 112 inverted. In the astable multivibrator 600, this inverted signal is returned to the amplifier input 112 after passing through the time delay 602. Thus, the result is a periodic square waveform at the amplifier output 114 of the VLSOA 110. This amplifier output 114 is used as the output 608 of the astable multivibrator 600.

The time delay 602 determines the frequency of the periodic square waveform at the output 608 of the astable multivibrator 600. Varying the time delay 602 varies the frequency of the periodic square waveform. Advantageously, the astable multivibrator 600 illustrated in FIG. 6 is capable of generating a waveform with a much higher frequency than electronic systems generate. In one embodiment, the time delay 602 is provided by a length of optical fiber. The length of the optical fiber determines the amount of delay. A longer optical fiber means a longer delay and a lower frequency at the output 608. In an alternate embodiment, the time delay 602 is a silicon waveguide. Again, a longer silicon waveguide means a longer delay and lower frequency. For example, routing the ballast laser signal from 116 through a 1 mm length of silicon waveguide as the time delay 602 prior to the amplifier input 112 provides a waveform at the output 608 of the astable multivibrator 600 of 100–160 Gigahertz, provided the stimulated emission time of the laser is not exceeded and there is enough gain to sustain the oscillation.

The frequency of the signal at the output 608 of the astable multivibrator 600 can also be varied by changing the wavelength of the ballast laser signal of the VLSOA 110. By changing the wavelength of the ballast laser output from 116, the time delay also changes, due to dispersion, as the ballast laser signal travels through the time delay 602 material.

Figure 7:
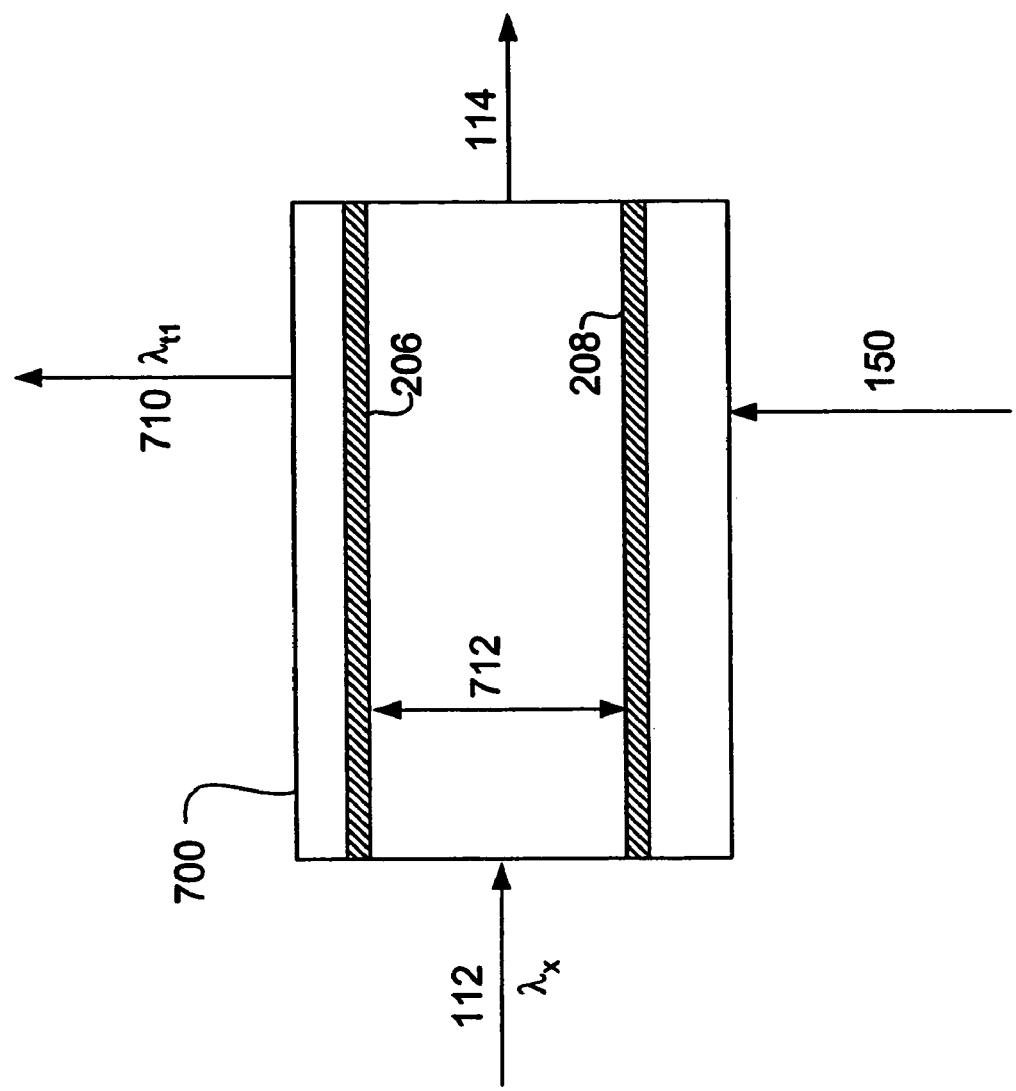
FIG. 7 is a diagram of an embodiment of a tunable VLSOA.

FIG. 7 is a diagram of an embodiment of a tunable VLSOA 700, having a ballast laser signal 710 which is tunable in wavelength. The optical path length of the laser cavity determines the wavelength $\lambda_{t1}$ of the ballast laser signal. Two aspects of the tunable VLSOA 700 primarily determine the optical path length, and thus the wavelength $\lambda_{t1}$: the distance 712 between the mirrors 206 and 208 of the laser cavity and the refractive index of the materials in the laser cavity. In the tunable VLSOA 700, the distance 712 between the mirrors 206 and 208, the refractive index, or both the distance 712 and the refractive index, are variable. The optical path length can be changed physically, electro-optically, photo-optically, thermo-optically, through carrier injection, and by other methods.

These methods used to tune the wavelength $\lambda_{t1}$ of the VLSOA 700 include: (a) ring cavities where the length of the ring determines the wavelength; (b) coupled cavity resonators, where a series of Fabry-Perot cavities, or rings, or another resonant cavity collectively determine the wavelength $\lambda_{t1}$; (c) photonic band gap resonators and filters—a group of resonators and filters that are very small and filter photons much in the same way electrons in a crystal form bandgaps; (d) directional coupler filters, which allow two modes to be coupled in a wavelength dependent manner using waveguide guide modes or another type of mode; (e) grating assisted couplers, which are similar to directional coupler filters, but a grating (periodic index or gain/absorption perturbations) is used to help select the peak wavelength; (f) diffraction gratings, which cause a periodic change in index of refraction or gain/absorption across the transverse profile of the light beam such that wavelength dependent diffraction peaks ($1^{st}$ order, $2^{nd}$ order, etc.) result; (g) Echelle gratings, or one of many other types of gratings; (h) arrayed waveguide gratings, which are a series of waveguides that are phased to give wavelength dependent transmission, such as a phased array radar antenna system; (i) multi-mode interferometer filters, which utilize higher order transverse modes and their coupling between each other to achieve filter and splitter effects; (j) an asymmetric Mach-Zhender filter, which is a type of filter that utilizes a splitter, two unequal optical path lengths, and a combiner to achieve a filtered response (this can also be done using two polarizations); (k) Sagnac interferometer filter, which is similar to the Mach-Zhender but in a ring type configuration.

Figure 8A:
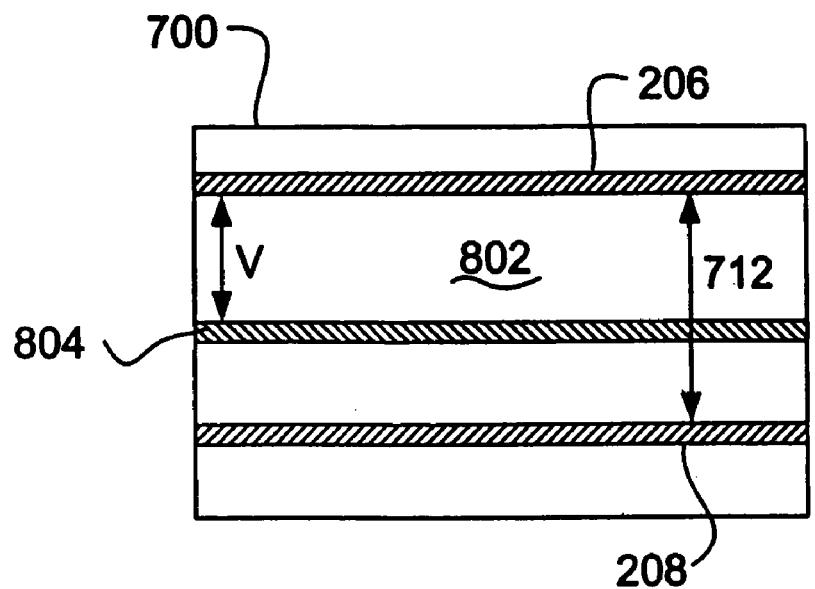
FIG. 8A is a diagram of a tunable VLSOA with a variable distance between mirrors.

FIG. 8A is a simplified side view of a tunable VLSOA 700 with a variable distance 712 between mirrors 206 and 208. Changing the distance 712 between the mirrors 206 and 208 changes the optical path length, and thus the wavelength of the ballast laser output. There are several ways to change the distance 712 between the mirrors 206 and 208.

A first embodiment of a tunable VLSOA 700 with a variable distance 712 between the mirrors 206 and 208 uses a micro electromechanical system (MEMS) to adjust the distance 712. The tunable VLSOA 700 includes an air gap 802 between the top mirror 206 and the bottom mirror 208. The top mirror 206 is capable of moving closer or further from the bottom mirror 208. In one embodiment, the range of motion of the top mirror 206 is approximately 30 nm. A voltage V is applied between the top mirror 206 and a conducting layer 804 to move the top mirror 206. As the voltage V is changed, the top mirror 206 moves and the distance between the mirrors 206 and 208 changes. In one embodiment, the top mirror 206 is an electrostatic deformable membrane. Preferably, as the top mirror 206 moves, it remains parallel to the active region of the tunable VLSOA 700.

Figure 8B:
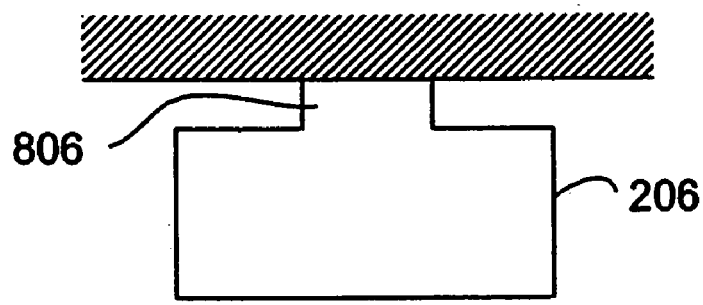
FIG. 8B is a diagram of a VLSOA with a top mirror suspended in an air gap by a cantilever section.
Figure 8C:
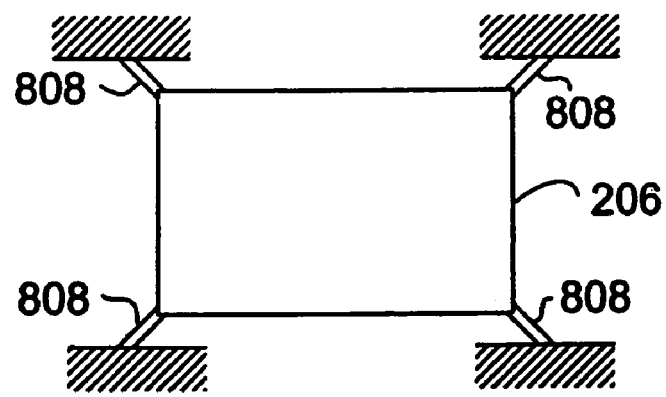
FIG. 8C is a diagram of a VLSOA with a top mirror suspended in an air gap by four flexible tethers.

There are many arrangements of the top mirror 206 that allow the top mirror 206 to move. In one embodiment, shown in top view in FIG. 8B, the top mirror 206 is suspended in the air gap 802 by a cantilever section 806. In another embodiment, shown in top view in FIG. 8C, the top mirror 206 is suspended by four flexible tethers 808. Alternatively, a different number of tethers 808 could be used.

Figure 9:
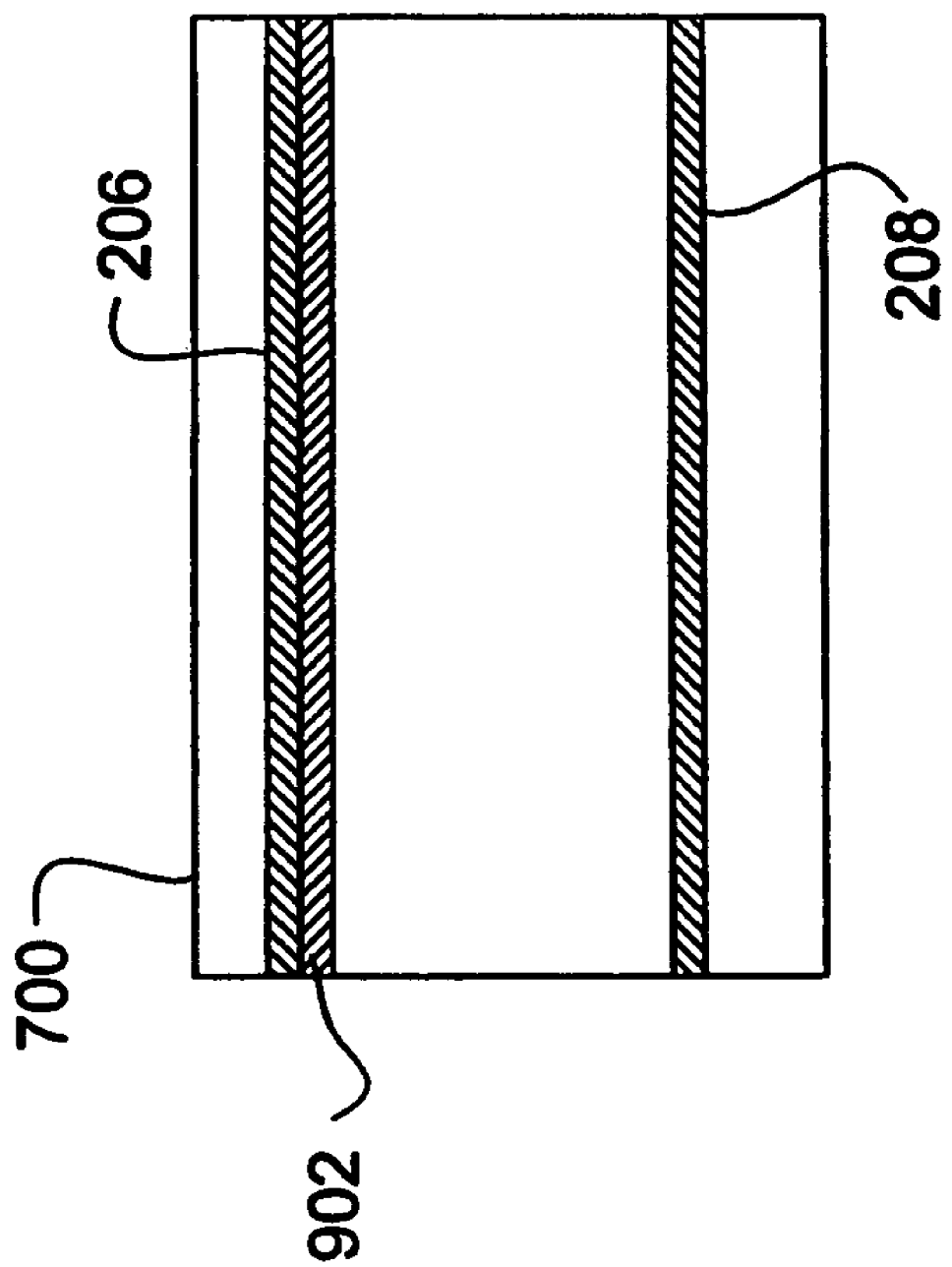
FIG. 9 is a diagram of an embodiment of a tunable VLSOA with a tunable laser output wavelength.

The refractive index can also be changed to change the optical path length. There are several ways to change the refractive index. FIG. 9 is a diagram of an embodiment of a tunable VLSOA 700 with a tunable laser output wavelength. The embodiment of the tunable VLSOA 700 shown in FIG. 9 includes a tunable region 902 between the active region and the top mirror 206. The tunable region 902 could also be placed between the active region and the bottom mirror 208. The wavelength of the laser output is tuned by changing the refractive index of the tunable region 902.

In a first embodiment, the tunable region 902 is a liquid crystal layer. Applying a voltage across the liquid crystal layer controllably changes the refractive index. In another embodiment, layers of temperature sensitive materials are used to make up the tunable region 902. Changing the temperature changes the refractive index of the layers of temperature sensitive materials.

Additionally, the index of refraction of the tunable region 902 may be adjusted using physical mechanisms which occur within semiconductor material such as, for example, the thermo-optic effect, the Stark effect, the quantum-confined Stark effect, the Franz-Keldysh effect, the Burstein-Moss effect (band filling), the electro-optic effect, the acousto-optic effect, or other techniques. Further, electrons and/or holes can be injected into the tunable region to cause a change in the refractive index.

Thus, it is possible to control the wavelength of the ballast laser signal at the output 116. Owing to an enhanced or naturally occurring dispersion in the time delay element 602, a different wavelength of the laser output results in a different time delay, hence the frequency or repetition rate of the output 608 is also controlled by controlling the wavelength of the laser output. A VLSOA with a tunable laser output wavelength provides an astable multivibrator 600 with a controllable output frequency.

In an alternative embodiment, the output frequency is controlled by changing the index of refraction of the material providing the time delay. Changing the index of refraction of the time delay material changes the time delay provided by the time delay material. The index of refraction of the material providing the time delay can be changed using the same methods described above to change the index of refraction of the tunable region 902.

Thus, the astable multivibrator 600 is capable of providing a square waveform output over a range of frequencies.

Figure 10:
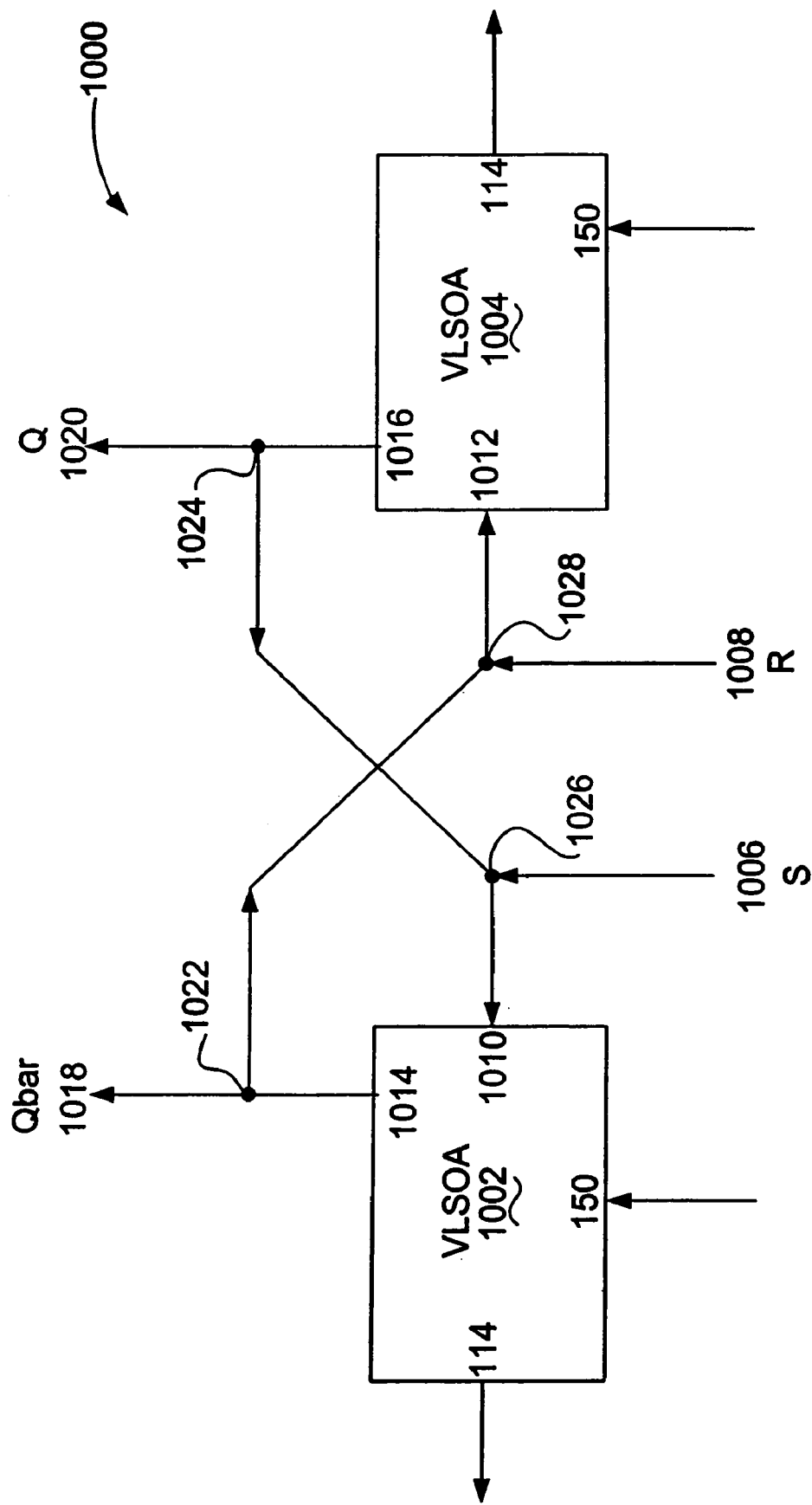
FIG. 10 is a block diagram of an embodiment of an optical RS latch.

RS Latch:

FIG. 10 is a diagram of an optical RS latch 1000. The latch 1000 has an S input 1006, an R input 1008, a Qbar output 1018, and a Q output 1020. The latch 1000 includes a first VLSOA 1002, a second VLSOA 1004, two combiners 1026 and 1028, and two splitters 1022 and 1024. The first VLSOA 1002 has a pump input 150, an amplifier input 1010, an amplifier output 114 and a ballast laser output 1014. Similarly, the second VLSOA 1004 has a pump input 150, an amplifier input 1012, an amplifier output 114 and a ballast laser output 1016.

The components of the latch 1000 are coupled as follows. Combiner 1026 receives two inputs, the S input 1006 and an input received from the ballast laser output 1016 from the second VLSOA 1004 via splitter 1024. The output of combiner 1026 is coupled to the amplifier input 1010 of the first VLSOA 1002. The ballast laser output 1014 of the first VLSOA 1002 is coupled to splitter 1022. One output of splitter 1022 goes to the Qbar output 1018 and another output of splitter 1022 goes to combiner 1028. Combiner 1028 receives the output from splitter 1022 as well as the R input 1008. The output of combiner 1028 is coupled to the input 1012 of the second VLSOA 1004. The ballast laser output 1016 of the second VLSOA 1004 is coupled to splitter 1024. One output of splitter 1024 is coupled to combiner 1026 and the other output goes to the Q output 1020. In general, the amplifier outputs 114 of the first and second VLSOAs 1002 and 1004 are discarded or are used as amplified replicas of the Q and Qbar outputs 1018 and 1020.

The optical RS latch 1000 operates as follows. VLSOAs 1002 and 1004 operate primarily as inverters. If R 1008 and S 1006 are both low, then the device is bistable and "remembers" its last state. If S 1006 is asserted high with R 1008 low, then the device is set to a state with Q 1020 high and Qbar 1018 low. Conversely, if R 1008 is asserted high with S 1006 low, the device is reset to Q 1020 low and Qbar 1018 high.

The optical latch 1000 implements this functionality as follows. First consider the first VLSOA 1002 of latch 1000. VLSOA 1002 is designed so that either a strong S 1006 signal or a strong Q 1020 signal (received via splitter 1024 and combiner 1026) is sufficient to result in an amplifier output 114 which is strong enough to deplete the ballast laser signal, resulting in a weak Qbar 1018 signal at output 1014. In other words, if S 1006 is strong (digital "1"), then the amplifier output 114 will be strong and the ballast laser output 1014 will be weak (i.e., Qbar 1018 will be a digital "0"). Similarly, if Q 1020 is strong (digital "1"), then the amplifier output will be strong and the ballast laser output 1014 will be weak (i.e., Qbar 1018 will be a digital "0").

Therefore, the combiner 1026 and VLSOA 1002 together implement a digital NOR gate, as described above with respect to FIG. 4B, with S 1006 and Q 1020 as the inputs and Qbar 1018 as the output. VLSOA 1004 together with combiner 1028 operate similarly and implement a second NOR gate, with R 1008 and Qbar 1022 as the inputs and Q 1020 as the output. Thus, optical RS latch 1000 consists of two cross-coupled NOR gates, which is a conventional digital design for an RS latch.

The optical latch 1000 has two stable states. The first stable state occurs if R 1008 is low, and a high signal is input at S 1006. In the first stable state, Qbar 1018 is low and Q 1020 is high. This occurs because the high S 1006 input causes the ballast laser output 1014 of the first VLSOA 1002 to be weak, which in turn means that Qbar 1018 is weak, and only weak signals (digital "0's") are received at combiner 1028. Since only weak signals are input to the second VLSOA 1004, the ballast laser output 1016 of the second VLSOA 1004 is high. This high signal is then sent to the input 1010 of the first VLSOA 1002 via the splitter 1024 and the combiner 1026. Thus, since the high signal from the second VLSOA 1004 is then being input to the first VLSOA 1002, the optical latch 1000 remains in the first stable state if the high signal at the S 1006 input is subsequently removed. The second stable state is similar to the first. However, in the second stable state, a high signal is input to the R 1008 input while the S 1006 input is low. In the second stable state, Qbar 1018 is high and Q 1020 is low.

Figure 11A:
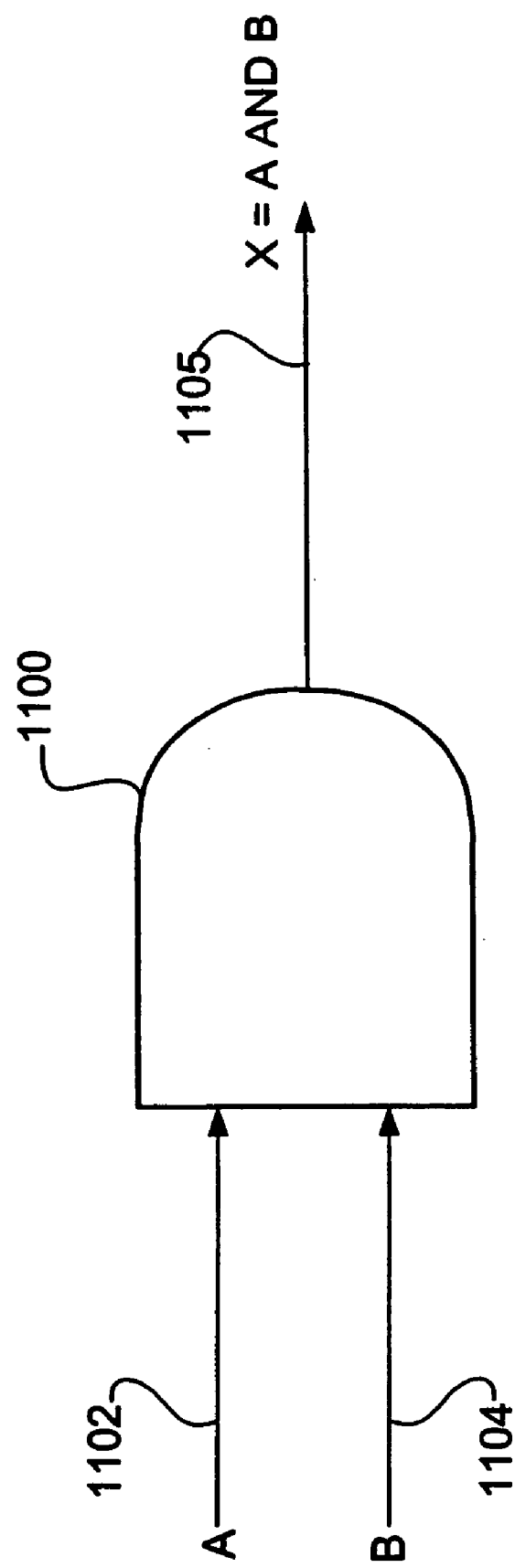
FIG. 11A is a representation of an optical AND gate.

Optical AND Gate:

FIG. 11A is a representation of an optical AND gate 1100. An optical AND gate 1100 is similar in function to an electronic AND gate, but operates with optical signals, instead of electrical signals. The input signals A and B enter the optical AND gate 1100 on two inputs 1102 and 1104. The output 1105 then outputs a signal X that varies based on the values of the input signals. If both of the signals A and B on the inputs 1102 and 1104 are high, then the signal X on the output 1105 is high. If either or both of the signals A and B on the inputs 1102 and 1104 are low, the signal X on the output 1105 is low.

Two embodiments of and optical AND gate 1100 are described. The first embodiment of an optical AND gate 1100 is simpler than the second embodiment. The first embodiment comprises the NAND gate 500 described above and shown in FIGS. 5A and 5B in combination with the NOT gate 300 described above and shown in FIGS. 3A and 3B. In the first embodiment, the NAND gate 500 output 506 is simply used as the input 302 to the NOT gate 300. Thus, the NOT gate 300 inverts the NAND gate 500 output and the resulting combination is an optical AND gate.

Figure 11B:
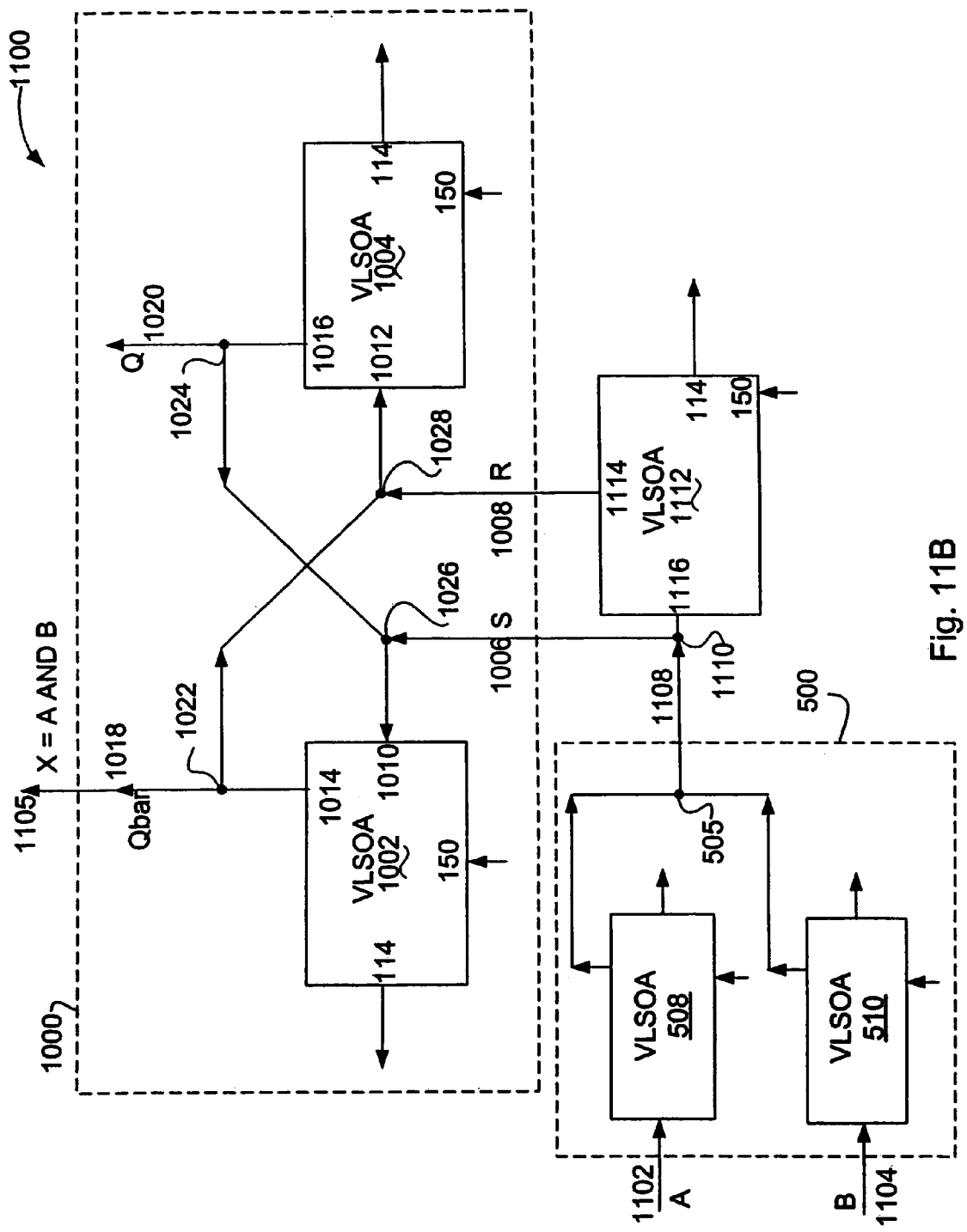
FIG. 11B is a block diagram of an embodiment of an optical AND gate.

FIG. 11B is a block diagram of a second embodiment of an optical AND gate 1100. The optical AND gate 1100 includes the optical RS latch 1000 described above with respect to FIG. 10. In addition to the optical RS latch 1000, the optical AND gate 1100 comprises the optical NAND gate 500 described above with respect to FIG. 5B, a first input 1102 (also used as the first input to the NAND gate 500), a second input 1104 (also used as the second input to the NAND gate 500), an input splitter 1110, and a third VLSOA 1112. Qbar 1018 of the optical RS latch 1000 is used as the output 1105 of the optical AND gate 1100.

These components of the optical AND gate 1100 are coupled as follows. Both the first input 1102 and the second input 1104 are coupled to the optical NAND gate 500. The output 1108 of the NAND gate 500 is coupled to the input splitter 1110. One output of the input splitter 1110 is coupled to the S input 1006 of the optical RS latch 1000. The other output of the input splitter 1110 is coupled to the amplifier input 1116 of the third VLSOA 1112. The ballast laser output 1114 of the third VLSOA 1112 is coupled to the R input 1008 of the optical RS latch 1000. In general, the amplifier output 114 of the third VLSOA 1112 is discarded.

The optical AND gate 1100 functions as follows. The input signals received at the first and second inputs 1102 and 1104 are received at the NAND gate 500. The output 1108 of the NAND gate 500 is sent to the input splitter 1110. Part of the split signal from the input splitter 1110 is sent to the S input 1006 of the optical RS latch 1000. Part of the split signal from the input splitter 1110 is also sent from the input splitter 1110 to the amplifier input 1116 of the third VLSOA 1112. The ballast laser output 1114 of the third VLSOA 1112 is coupled to the R input 1008 of the optical RS latch 1000. Since the ballast laser output 1114 of the third VLSOA 1112 is used, the third VLSOA 1112 functions as an inverter, as described above with respect to the optical NOT gate 300. Because the third VLSOA 1112 functions as an inverter, the signal received at the R input 1008 of the optical RS latch 1000 is the opposite of the signal received at the S input 1006 of the optical RS latch 1000. Therefore, a high signal is input to either the S input 1006 or the R input 1008, and a low signal to the other input 1006, 1008.

If the output 1108 of the NAND gate 500 is high, the S input 1006 to the optical RS latch 1000 is high and the R input 1008 to the optical RS latch 1000 is low. Therefore, Qbar 1018, used as the output to the optical AND gate 1100, is low and Q 1020 is high. Thus, if either input 1102 or 1104 is low, the output 1108 of the NAND gate 500 is high, and the optical AND gate 1100 output 1105 is low. If both the inputs 1102 and 1104 are high, the output of the NAND gate 500 is low, and therefore Qbar, and the AND gate output 1105, is high.

Thus, the optical AND gate 1100 has an output 1105 of high (digital "1") if both the inputs 1102 and 1104 are high. The optical AND gate 1100 has an output 1105 of low (digital "0") if either or both of the inputs 1102 and 1104 are low.

In addition, if Q 1020 is used as the output, the optical AND gate 1100 functions as another embodiment of an optical NAND gate. This is because Q 1020 provides the opposite signal that Qbar 1018 does.

Figure 12A:
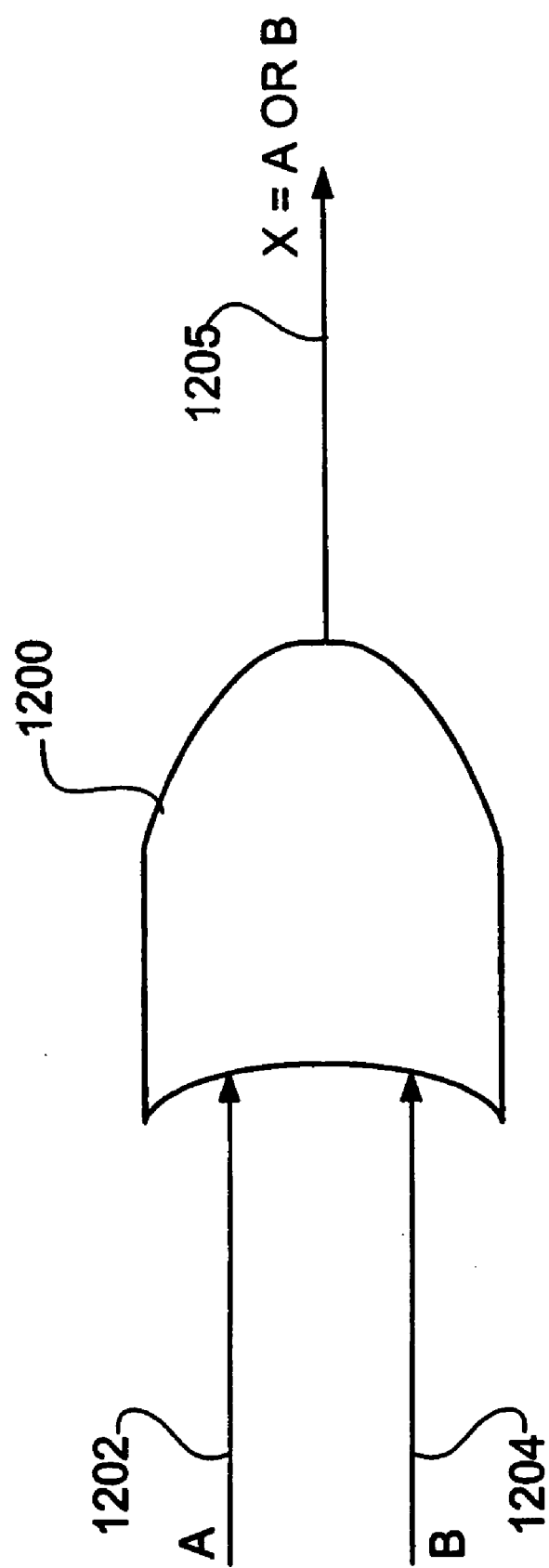
FIG. 12A is a representation of an optical OR gate.

Optical OR Gate:

FIG. 12A is a representation of an optical OR gate 1200. An optical OR gate 1200 is similar information to an electronic OR gate, but operates with optical signals instead of electrical signals. The input signals A and B enter the optical OR gate 1200 on two inputs 1202 and 1204. The output 1205 then outputs a signal X that is based on the values of the input signals. If both of the signals A and B on the inputs 1202 and 1204 are low, then the signal X on the output 1205 is low. If either or both of the signals A and B on the inputs 1202 and 1204 are high, the signal X on the output 1205 is high.

Figure 12B:
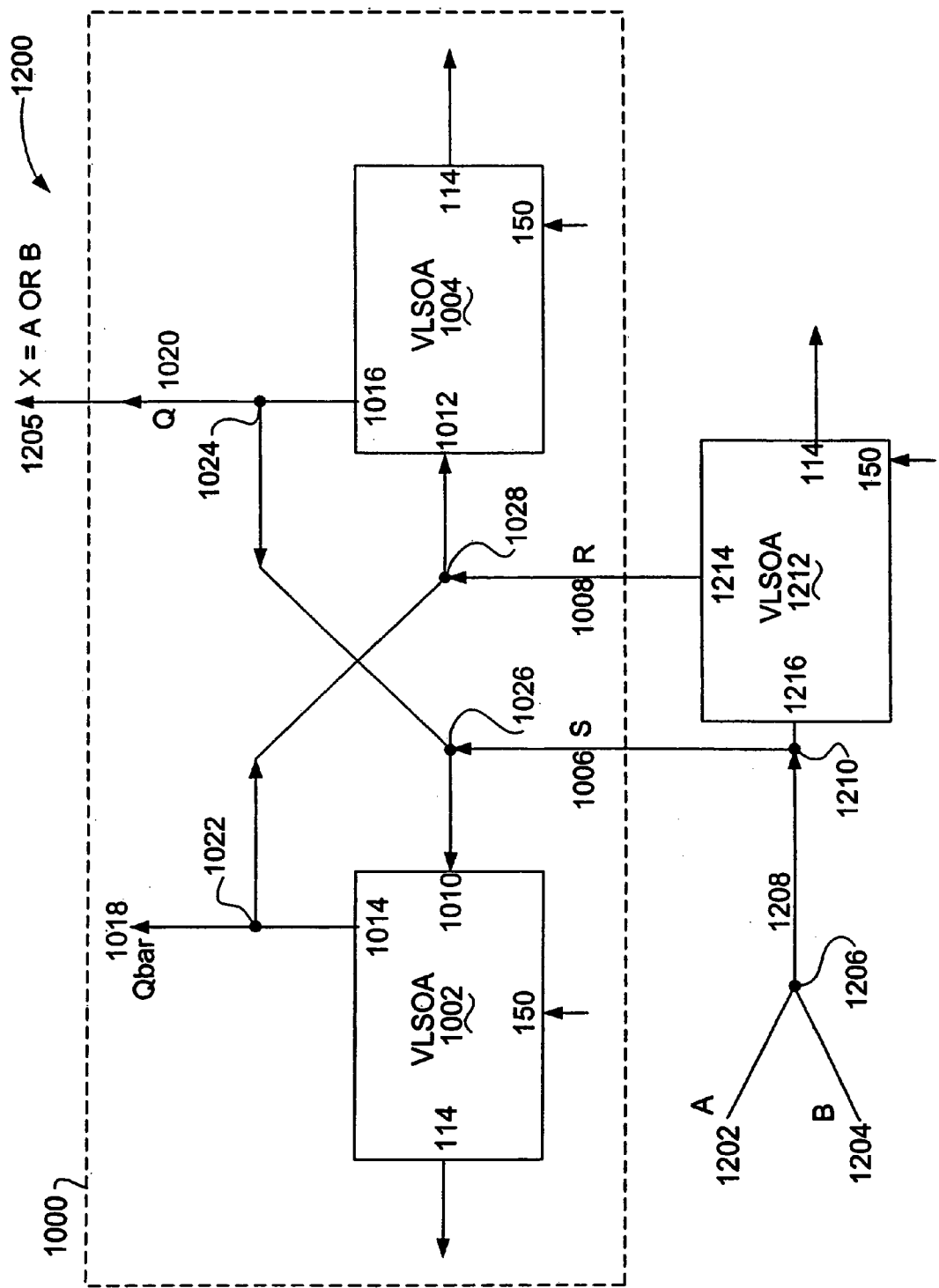
FIG. 12B is a block diagram of an embodiment of an optical OR gate.

FIG. 12B is a block diagram of an embodiment of an optical OR gate 1200. The optical OR gate 1200 is based on a NOR gate (combiner 1208 and VLSOA 1212) and RS latch 1000 in the same way that the AND gate 1110 of FIG. 11B is based on a NAND gate (combiner 1106 and VLSOA 1112) and RS latch 1000. However, in FIG. 12B the VLSOAs 1212, 1002, and 1004 have depletion thresholds selected to function as an OR gate, instead of an AND gate.

In the optical OR gate 1200, only one of the inputs 1202 or 1204 need be high in order to cause Q 1020, and the output 1205 of the optical OR gate 1200, to be high. The depletion thresholds of VLSOAs 1212 and 1002 are selected so that the ballast laser outputs 1014 and 1214 are low (digital "0") if at least one of the inputs 1202 and 1204 are high. Thus, if one or both of the inputs 1202 and 1204 are high, the ballast laser outputs 1014 and 1214 are low. In such a case, the inputs received at combiner 1028 are low, the signal received at the amplifier input 1012 of the second VLSOA 1004 is low, and the ballast laser output 1016 of the second VLSOA 1004 is high. This results in Q 1020, and the output 1205 of the optical OR gate 1206, being high.

If both the inputs 1202 and 1204 are low, then Q 1020, and the output 1205 of the optical OR gate 1200, is low. The low signal inputs are input to VLSOAs 1002 and 1212. Since the inputs are low and the VLSOAs 1002 and 1212 act as inverters, the laser outputs 1014 and 1214 are high. High laser output 1014 is split at splitter 1022 then combined with high ballast laser output 1214 at combiner 1028. The combined high laser outputs 1014 and 1214 are then received at the amplifier input 1012 of the second VLSOA 1004. In response, the ballast laser output 1016 of the second VLSOA 1004 is low. Therefore, Q 1020, and the output 1205 of the optical OR gate 1200, is low.

Thus, the optical OR gate 1200 outputs a high signal (digital "1") when one or both of the inputs are high, and outputs a low signal (digital "0") when both of the inputs are low.

In another embodiment of an optical OR gate, the first VLSOA 1002 is not used. The components of this embodiment are coupled as follows. The first input 1202 and the second input 1204 are coupled to the input combiner 1206. The input combiner 1206 is coupled to the amplifier input 1216 of the third VLSOA 1212. The laser output 1214 of the third VLSOA 1212 is coupled to the amplifier input 1012 of the second VLSOA 1004. The ballast laser output 1016 of the second VLSOA 1004 is used as the output 1205 of the optical OR gate.

This embodiment of the optical OR gate functions as follows. The input signals received at the first and second inputs 1202 and 1204 are combined. The combined input 1208 is sent to the amplifier input 1216 of the third VLSOA 1212. The two inputs 1202, 1204, the third VLSOA 1212, and the ballast laser output 1214 of the third VLSOA 1212 function as a NOR gate, as described above with respect to FIG. 4B. The ballast laser output 1214 of the third VLSOA 1212, which carries a NOR gate signal, is coupled to the amplifier input 1012 of the second VLSOA 1004. The second VLSOA 1004 functions as an inverter. Since the signal received at the amplifier input 1012 of the second VLSOA 1004 is a NOR output, and the second VLSOA 1004 functions as an inverter, the ballast laser output 1016 of the second VLSOA 1004, and also the output 1205 of the optical OR gate, is an OR output.

Thus, this embodiment of the optical OR gate has an output 1205 of high (digital "1") if either or both of the inputs 1202 and 1204 are high. This embodiment of the optical OR gate has an output 1205 of low (digital "0") if both of the inputs 1202 and 1204 are low.

Figure 13:
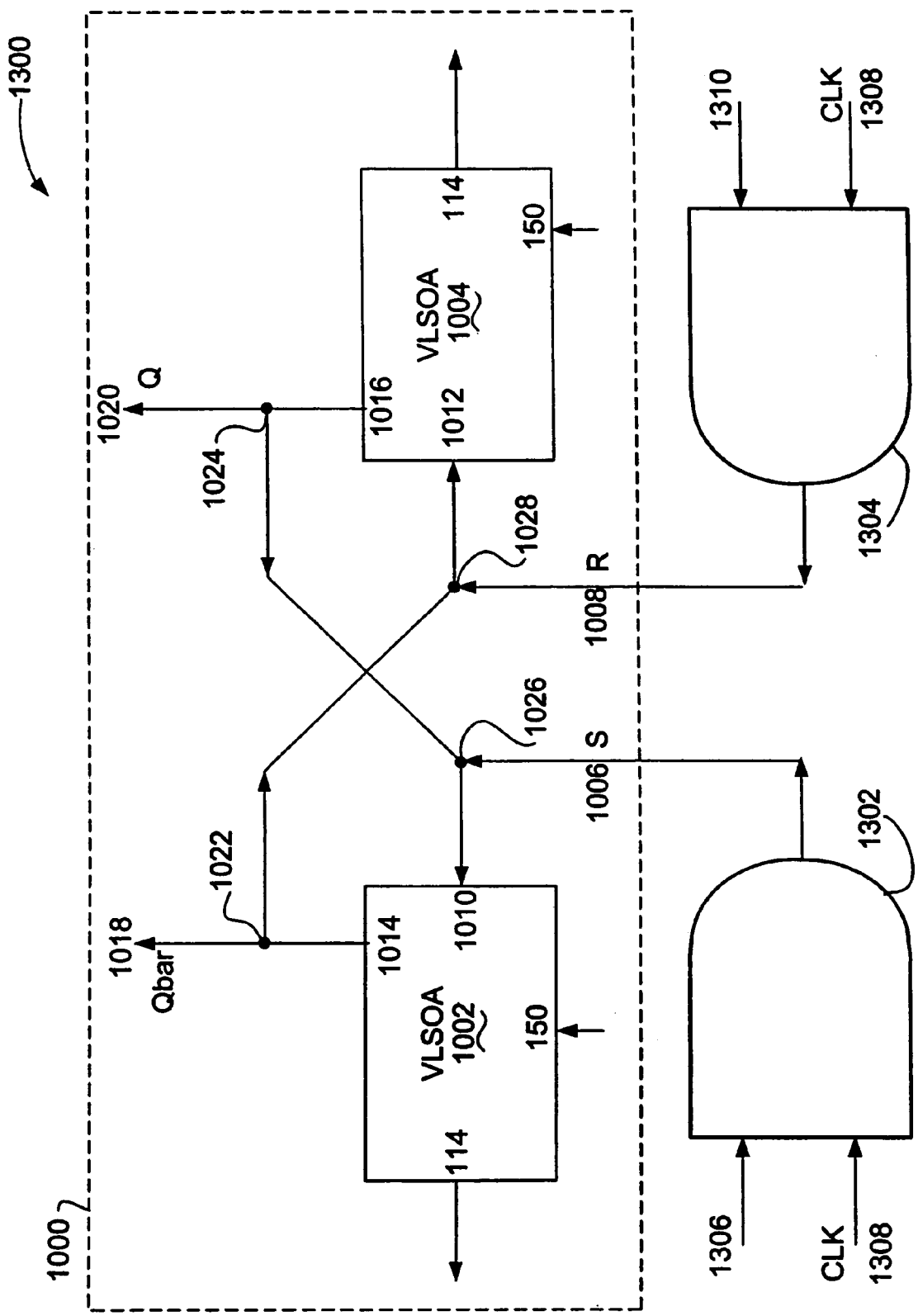
FIG. 13 is a block diagram of an embodiment of an optical clocked latch.

Other Optical Logic Devices:

Several embodiments of optical logic devices have been described above including the basic building blocks of NOT, NAND, NOR and latch. Many other optical logical devices may be made based on the embodiments and concepts disclosed above. In addition, the optical logical devices described may be combined to form other optical logic devices using conventional digital design principles. Other latches and flip-flops, including D, JK, synchronous and asynchronous varieties may also be constructed, as can more complex digital circuits. For example, FIG. 13 is a diagram of an embodiment of an optical clocked latch 1300. The optical clocked latch 1300 incorporates the optical RS Latch 1000 as well as two optical AND gates 1100, a first optical AND gate 1302 and a second optical AND gate 1304. The optical clocked latch 1300 has a first input 1306 connected to the first optical AND gate 1302 and a second input 1310 connected to the second optical AND gate 1304. A clock input (CLK) 1308 is connected to each of the first and second optical AND gates 1302 and 1304.

The optical clocked latch 1300 acts like the optical RS latch 1000 described above, except that the stable states of the optical clocked latch 1300 may only change during the times when the clock input is high. This is because the optical AND gates 1302 and 1304 require both the clock input 1308 and the other input, either 1306 or 1310, to be high for the input, either 1006 or 1008, to the optical RS latch 1000 to be high.

While the invention has been particularly shown and described with reference to a preferred embodiment and several alternate embodiments, it will be understood by persons skilled in the relevant art that various changes in form and details can be made therein without departing from the spirit and scope of the invention.

What is claimed is:

1. An optical latch, comprising:
   a "SET" input and a "RESET" input, the optical latch being configured to achieve at least one stable state in response to the input of predetermined signals to, respectively, the "SET" input and the "RESET" input;
   a first output and a second output; and
   first and second lasing semiconductor optical amplifiers (LSOAs), each of the first and second LSOAs having an input configured to receive optical signals and a laser output configured to output a laser output optical signal in response to a received optical signal, the input of the first LSOA being connected to the "SET" input and to the laser output of the second LSOA, the input of the second LSOA being connected to the "RESET" input and to the laser output of the first LSOA, the laser output of the first LSOA being connected to the first output, and the laser output of the second LSOA being connected to the second output.

2. The optical latch as recited in claim 1, wherein, in the at least one stable state, an output signal from the first output is low and an output signal from the second output is high.

3. The optical latch as recited in claim 2, wherein the at least one stable state is achieved in response to the input of a high signal to the "SET" input and the input of a low signal to the "RESET" input.

4. The optical latch as recited in claim 1, wherein, in the at least one stable state, an output signal from the first output is high and an output signal from the second output is low.

5. The optical latch as recited in claim 4, wherein the at least one stable state is achieved in response to the input of a low signal to the "SET" input and the input of a high signal to the "RESET" input.

6. The optical latch as recited in claim 1, wherein the optical latch has at least two stable states.

7. The optical latch as recited in claim 1, wherein at least one of the LSOAs comprises a vertical lasing semiconductor optical amplifier (VLSOA).

8. The optical latch as recited in claim 1, wherein the optical latch has a bistable state.

9. The optical latch as recited in claim 1, wherein the bistable state is achieved when both the "SET" and "RESET" inputs are low.

10. The optical latch as recited in claim 1, wherein the first LSOA further comprises:
    a laser cavity with an optical path;
    an amplifying path connected to the input of the first LSOA and passing through the laser cavity, the amplifying path being configured to propagate optical signals received at the input; and
    a pump input connected to the laser cavity and configured to receive a pump for exceeding a lasing threshold for the laser cavity, the first laser output optical signal being output in response to propagation of the received optical data signals through the amplifying path.

11. The optical latch of claim 1, further comprising:
    a first combiner connected to the "SET" input, the input of the first LSOA, and the laser output of the second LSOA, the first combiner being configured to receive optical signals from the "SET" input and the laser output of the second LSOA, and the first combiner being further configured to output a combined optical signal to the input of the first LSOA; and
    a second combiner connected to the "RESET" input, the input of the second LSOA, and the laser output of the first LSOA, the second combiner being configured to receive optical signals from the "RESET" input and the laser output of the first LSOA, and the second combiner being further configured to output a combined optical signal to the input of the second LSOA.

12. The optical latch of claim 1, further comprising:
    a first splitter connected to the laser output of the first LSOA, the input of the second LSOA, and the first output, the first splitter being configured to receive optical signals from the laser output of the first LSOA, and the first splitter being further configured to output optical signals to the input of the second LSOA and to the first output; and
    a second splitter connected to the laser output of the second LSOA, the input of the first LSOA, and the second output, the second splitter being configured to receive optical signals from the laser output of the second LSOA, and the second splitter being further configured to output optical signals to the input of the first LSOA and to the second output.

13. An optical clocked latch, comprising:
a "SET" input and a "RESET" input, the optical clocked latch being configured to achieve at least one stable state in response to the input of predetermined signals to, respectively, the "SET" input and the "RESET" input;
a first output and a second output;
first and second lasing semiconductor optical amplifiers (LSOAs), each of the first and second LSOAs having an input configured to receive optical signals and a laser output configured to output a laser output optical signal in response to a received optical signal, the input of the first LSOA being connected to the "SET" input and to the laser output of the second LSOA, the input of the second LSOA being connected to the "RESET" input and to the laser output of the first LSOA, the laser output of the first LSOA being connected to the first output, and the laser output of the second LSOA being connected to the second output; and
a first optical AND gate and a second optical AND gate, each having a corresponding input and a clock input, an output of the first optical AND gate being connected to the "SET" input, and an output of the second optical AND gate being connected to the "RESET" input.

14. The optical clocked latch as recited in claim 13, wherein the optical clocked latch is configured so that the clock input to the first optical AND gate is the same as the clock input to the second optical AND gate.

15. The optical clocked latch as recited in claim 13, wherein the clock input to both of the optical AND gates is high for the at least one stable state.

16. The optical clocked latch as recited in claim 13, wherein in the at least one stable state, an output signal from the first output is low and an output signal from the second output is high.

17. The optical clocked latch as recited in claim 16, wherein the at least one stable state is achieved in response to the input of a high signal to the "SET" input and the input of a low signal to the "RESET" input.

18. The optical clocked latch as recited in claim 13, wherein, in the at least one stable state, an output signal from the first output is high and an output signal from the second output is low.

19. The optical clocked latch as recited in claim 18, wherein the at least one stable state is achieved in response to the input of a low signal to the "SET" input and the input of a high signal to the "RESET" input.

20. The optical clocked latch as recited in claim 13, wherein the optical clocked latch has at least two stable states.

21. The optical clocked latch as recited in claim 20, wherein the clock input to both of the optical AND gates is high for each of the at least two stable states.

22. The optical clocked latch as recited in claim 13, wherein at least one of the LSOAs comprises a vertical lasing semiconductor optical amplifier (VLSOA).

23. The optical clocked latch as recited in claim 13, wherein the optical clocked latch has a bistable state.

24. The optical clocked latch as recited in claim 23, wherein the bistable state is achieved when both the "SET" and "RESET" inputs are low.

25. An optical latch, comprising:
a first vertical lasing semiconductor optical amplifier (VLSOA) having a pump input, an amplifier input, an amplifier output, and a ballast laser output;
a first combiner connected to a "SET" input and a second input and having an output arranged for communication with the amplifier input of the first VLSOA;
a first splitter having a "Qbar" output and a second output and having an input arranged for communication with the ballast laser output of the first VLSOA;
a second VLSOA having a pump input, an amplifier input, an amplifier output, and a ballast laser output;
a second combiner connected to a "RESET" input and the second output of the first splitter, and having an output arranged for communication with the amplifier input of the second VLSOA; and
a second splitter having a "Q" output and a second output, the second output being in communication with the second input of the first combiner, and the second splitter having an input arranged for communication with the ballast laser output of the second VLSOA.

26. The optical latch as recited in claim 25, wherein the optical latch has at least first and second stable states.

27. The optical latch as recited in claim 25, wherein the first stable state is achieved in response to the input of a high signal to the "SET" input and the input of a low signal to the "RESET" input, and, in the first stable state, an output signal from the "Qbar" output is low and an output signal from the "Q" output is high.

28. The optical latch as recited in claim 25, wherein the second stable state is achieved in response to the input of a low signal to the "SET" input and the input of a high signal to the "RESET" input, and, in the second stable state, an output signal from the "Qbar" output is high and an output signal from the "Q" output is low.

29. The optical latch as recited in claim 25, further comprising:
a first optical AND gate having an input and a clock input, an output of the first optical AND gate being connected to the "SET" input; and
a second optical AND gate having an input and a clock input, an output of the second optical AND gate being connected to the "RESET" input.

30. The optical latch as recited in claim 29, wherein the optical latch is configured so that the clock input to both of the optical AND gates is high for the at least first and second stable states.

31. The optical latch as recited in claim 25, wherein the optical latch has a bistable state.

32. The optical latch as recited in claim 31, wherein the bistable state is achieved when both the "SET" and "RESET" inputs are low.

* * * * *

UNITED STATES PATENT AND TRADEMARK OFFICE
CERTIFICATE OF CORRECTION

| | | |
|---|---|---|
| PATENT NO. | : 7,126,731 B1 | Page 1 of 1 |
| APPLICATION NO. | : 10/789126 | |
| DATED | : October 24, 2006 | |
| INVENTOR(S) | : DiJaili et al. | |

It is certified that error appears in the above-identified patent and that said Letters Patent is hereby corrected as shown below:

Column 5
Line 66, change "FIG. 2" to --FIG. 2B--

Column 6
Line 19, change "FIG. 2" to --FIG. 2B--

Column 14
Line 31, after "Qbar", change "1022" to --1018--

Column 16
Line 35, after "OR gate", change "1206" to --1200--

Signed and Sealed this

Thirtieth Day of November, 2010

David J. Kappos
*Director of the United States Patent and Trademark Office*